United States Patent
Goeldi et al.

(10) Patent No.: US 10,763,701 B2
(45) Date of Patent: Sep. 1, 2020

(54) INDUCTIVE POWER TRANSFER CONTROL

(71) Applicant: Wiferion GmbH, Freiburg im Breisgau (DE)

(72) Inventors: Benriah Goeldi, Freiburg (DE); Johannes Tritschler, Freiburg (DE)

(73) Assignee: Wiferion GmbH, Freiburg im Breisgau (DE)

( * ) Notice: Subject to any disclaimer, the term of this patent is extended or adjusted under 35 U.S.C. 154(b) by 9 days.

(21) Appl. No.: 16/081,855

(22) PCT Filed: Mar. 10, 2017

(86) PCT No.: PCT/EP2017/055669
§ 371 (c)(1),
(2) Date: Aug. 31, 2018

(87) PCT Pub. No.: WO2017/157790
PCT Pub. Date: Sep. 21, 2017

(65) Prior Publication Data
US 2019/0148979 A1    May 16, 2019

(30) Foreign Application Priority Data
Mar. 16, 2016 (EP) .................................. 16160595

(51) Int. Cl.
*H02J 50/12* (2016.01)
*H02J 5/00* (2016.01)
(Continued)

(52) U.S. Cl.
CPC .............. *H02J 50/12* (2016.02); *G01R 19/12* (2013.01); *G01R 19/2513* (2013.01); *G01R 25/00* (2013.01); *H02J 5/005* (2013.01)

(58) Field of Classification Search
CPC .......... H02J 50/12; H02J 5/005; G01R 19/12; G01R 19/2513; G01R 25/00
See application file for complete search history.

(56) References Cited

U.S. PATENT DOCUMENTS

2010/0164458 A1* 7/2010 Pollard .................. F42C 11/04
                                                           323/284
2014/0321169 A1   10/2014 Mueller et al.
(Continued)

OTHER PUBLICATIONS

International Search Report and written opinion dated May 17, 2017 in connection with Application No. PCT/EP2017/055669.

*Primary Examiner* — Jared Fureman
*Assistant Examiner* — Duc M Pham
(74) *Attorney, Agent, or Firm* — Wolf, Greenfield & Sacks, P.C.

(57) ABSTRACT

A more efficient solution for a detection of operating conditions in an inductive power transfer system and for improved control of the inductive power transfer system. An operating condition at a secondary side of an inductive power transfer system is detected by measuring at least one electric variable at a primary side of the inductive power transfer system which is dynamically coupled to the operating condition at the secondary side of the inductive power transfer system. Then follows an analysis of the at least one electric variable over time at the primary side of the inductive power transfer system. This allows to detect a change of the operating condition at the secondary side of the inductive power transfer system. Also provided is a control method and related controller apparatus using the detection method.

21 Claims, 18 Drawing Sheets

(51) Int. Cl.
*G01R 19/12* (2006.01)
*G01R 19/25* (2006.01)
*G01R 25/00* (2006.01)

(56) References Cited

U.S. PATENT DOCUMENTS

| | | | |
|---|---|---|---|
| 2015/0061578 A1* | 3/2015 | Keeling | H02J 5/005 320/108 |
| 2015/0246614 A1 | 9/2015 | Dames et al. | |
| 2016/0126751 A1* | 5/2016 | Tsuda | H02J 7/025 307/104 |

* cited by examiner (a)

(b)

(a)

(b)

INDUCTIVE POWER TRANSFER CONTROL

CROSS-REFERENCE TO RELATED APPLICATIONS

This Application is a national stage filing under 35 U.S.C. 371 of International Patent Application Serial No. PCT/EP2017/055669, filed Mar. 10, 2017, which claims priority to European application number 16160595.1, filed Mar. 16, 2016. The entire contents of these applications are incorporated herein by reference in their entirety.

FIELD OF INVENTION

The present invention relates to inductive power transfer control, and in particular to a method of detecting operating conditions at a secondary side of an inductive power transfer system, to a control method using the detection method according to the present invention and to a controller using the control method according to the present invention.

BACKGROUND ART

Generally, inductive power transfer systems have a number of advantages over conductive power transfer systems. E.g., for electric vehicles it means that a plugging of a cable is no longer required.

FIG. 1 shows a schematic diagram of an inductive power transfer system 100 as known in the art.

As shown in FIG. 1, an inductive power transfer system 100 comprises at a transmission side a DC/AC converter 102, a transmission side controller 104, a transmission side compensation capacitor 106, and a transmitter coil 108 connected in series to the transmission side compensation capacitor 106. The series connection of the transmission side compensation capacitor 106 and the transmitter coil 108 is connected to the output side of the DC/AC converter 104.

As shown in FIG. 1, the inductive power transfer system 100 comprises at a receiving side a receiver coil 110 connected in series to a receiving side compensation capacitor 112. The series connection of the receiver coil 110 and the receiving side compensation capacitor 112 is connected to an input side of an AC/DC converter 114 which is operated under control of a receiving side controller 116. Parallel to the series connection of the receiver coil 110 and the receiving side compensation capacitor 112 there is connected a short circuit protection switch 118. At the output of the AC/DC converter 114 there is connected a load 120. For the connection of the load 120 there may be provided a DC/DC converter for control of the power level delivered to the load 120 (not shown in FIG. 1).

As shown in FIG. 1, a wireless communication link 122 may be established from the receiving side to the transmission side for exchange of control data and/or measurement data between from the receiving side to the transmission side.

Operatively, the DC/AC converter 102 is adapted to receive a DC input signal and adapted to convert it into a transmission side AC signal. The transmission side AC signal is output to the series connection of the transmission side compensation capacitor 106 and the transmitter coil 108 for generation of an oscillating magnetic field. The transmission side controller 104 is adapted to measure the characteristics of the transmission side AC signal and optionally the DC input signal for control of the DC/AC converter 102. In more detail, the transmission side controller 104 is adapted to control the DC/AC converter 102 such that the generated magnetic field oscillates at resonant frequency of the series connection of the transmission side compensation capacitor 106 and the transmitter coil 108.

Operatively, the receiver coil 110, when placed in the magnetic field produced by the transmitter coil 108, receives energy transmitted by the transmitter coil 108 through inductive coupling. The inductive coupling leads to the generation of a receiving side AC signal. Under control of the transmission side controller 116 the AC/DC converter 114 is adapted to convert the receiving side AC signal into a load side DC signal which is then forwarded to the load 120.

Operatively, the receiving side controller 116 is adapted to measure the receiving side AC signal and optionally the load side DC signal for control of a power delivered to the load 120. Further, the receiving side controller 116 is adapted to detect an error state at the receiving side for actuation of the short circuit protection switch 118. Operatively, measurement data and control data may be sent over the wireless communication link 122 to improve the control and to inform the transmitting side on fault conditions at the receiving side.

Generally, in inductive power transfer systems there is no direct hardware connection between the transmission side and the receiving side. However, in cases of errors on the receiving side it is essential that a response to the error state is achieved as soon as possible to reduce or stop power transmission from the transmission side.

Further, if an open circuit error occurs at the receiving side, the receiving side AC signal will increase to levels that may be destructive to components in the inductive power transfer system or that may be even dangerous. Currently this problem is solved by detecting the over-voltage at the receiving side and by shorting the secondary resonant circuit constituted by the receiver coil 110 and the receiving side compensation capacitor 112 using the short circuit protection switch 118. Optionally, the error has to be communicated via the wireless communication link 122 to the transmission side to stop the power transmission. This short circuit protection switch 118 can be implemented using dedicated switches or, when available, using two high-side or two low-side active switches in the AC/DC converter 114.

However, communicating the error from the receiving side to the transmission side may be too slow. There are multiple delays added due to the analogue to digital conversion, the processing of the signal and the transmission delay caused by the wireless communication link 122.

Further, while the active short-circuiting by the short circuit protection switch 118 at the receiving side adds some level of safety it is nevertheless possible that the short circuit current increases above the rating of hardware components. Also, using the short circuit protection switch 118 leads to increased costs and complexity.

SUMMARY OF INVENTION

In view of the above, the object of the present invention is to provide a more efficient solution for detection of operating conditions in an inductive power transfer system for improved control of the inductive power transfer system.

According to a first aspect of the present invention this object is achieved by a method of detecting an operating condition at a secondary side of an inductive power transfer system.

The method according to the first aspect of the present invention comprises the step of measuring at least one electric variable at a primary side of the inductive power transfer system which is dynamically coupled to the operating condition at the secondary side of the inductive power transfer system.

The method according to the first aspect of the present invention further comprises the step of executing a first analysis of the at least one electric variable over time at the primary side of the inductive power transfer system for detection of a change of the operating condition at the secondary side of the inductive power transfer system.

According to the present invention the first analysis is executable for detection of the operating condition at the secondary side without use of measurement data measurable at the secondary side of the inductive power transfer system.

According to a second aspect of the present invention the object outlined above is achieved by a method of controlling an inductive power transfer system.

The method of controlling the inductive power transfer system comprises a step of detecting operating conditions at a secondary side of an inductive power transfer system using the method of detecting an operating condition at a secondary side of an inductive power transfer system according to the first aspect of the present invention.

The method of controlling the operation of the inductive power transfer system further comprises a step of controlling an operation of the inductive power transfer system in response to detected operating conditions at the secondary side of the inductive power transfer system.

According to a third aspect of the present invention the object outlined above is achieved by a controller using the method of controlling the inductive power transfer system according to the second aspect of the present invention.

DESCRIPTION OF DRAWINGS

In the following different aspects and examples of the present invention will be explained with reference to the drawing in which.

DETAILED DESCRIPTION OF INVENTION

Figure 1:
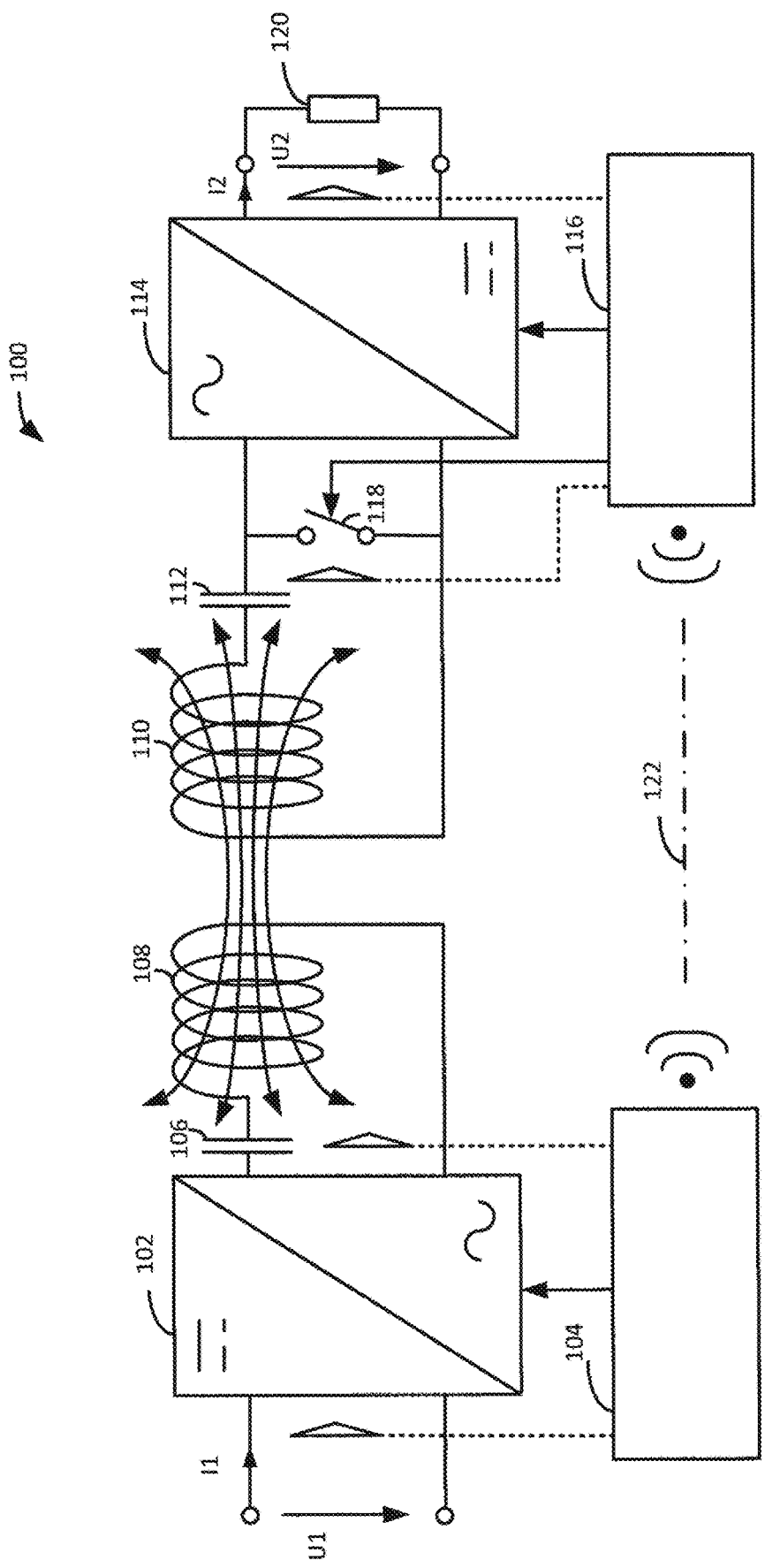
FIG. 1 shows a schematic circuit diagram of an inductive power transfer system as known in the prior art.

In the following the present invention will be explained in detail with reference to the drawing. Here, it should be understood that such explanation is related to examples of the present invention only and not binding to the scope of the present invention as defined by the claims. As far as reference is made to specific circuit components this is to be considered as example for the underlying functionality such the circuit components are clearly exchangeable as long as the same functionality is achieved.

The present invention described here uses the measurement signals available at the transmission side of the inductive power transfer system also referred to as primary side in the following to detect operating conditions, e.g., high and low impedance states, at the receiving side of the inductive power transfer system also referred to as secondary side in the following.

According to the present invention the inductive power transfer system can respond to an operating condition, e.g., an error at the secondary side, without mandatory use of measurement data that is measurable at the secondary side. There is no requirement for a wireless communication link or dedicated short circuit protection switch. Overall operating conditions can be detected intrinsically by using electrical signals available on the primary side in an efficient manner at low costs.

Figure 2:
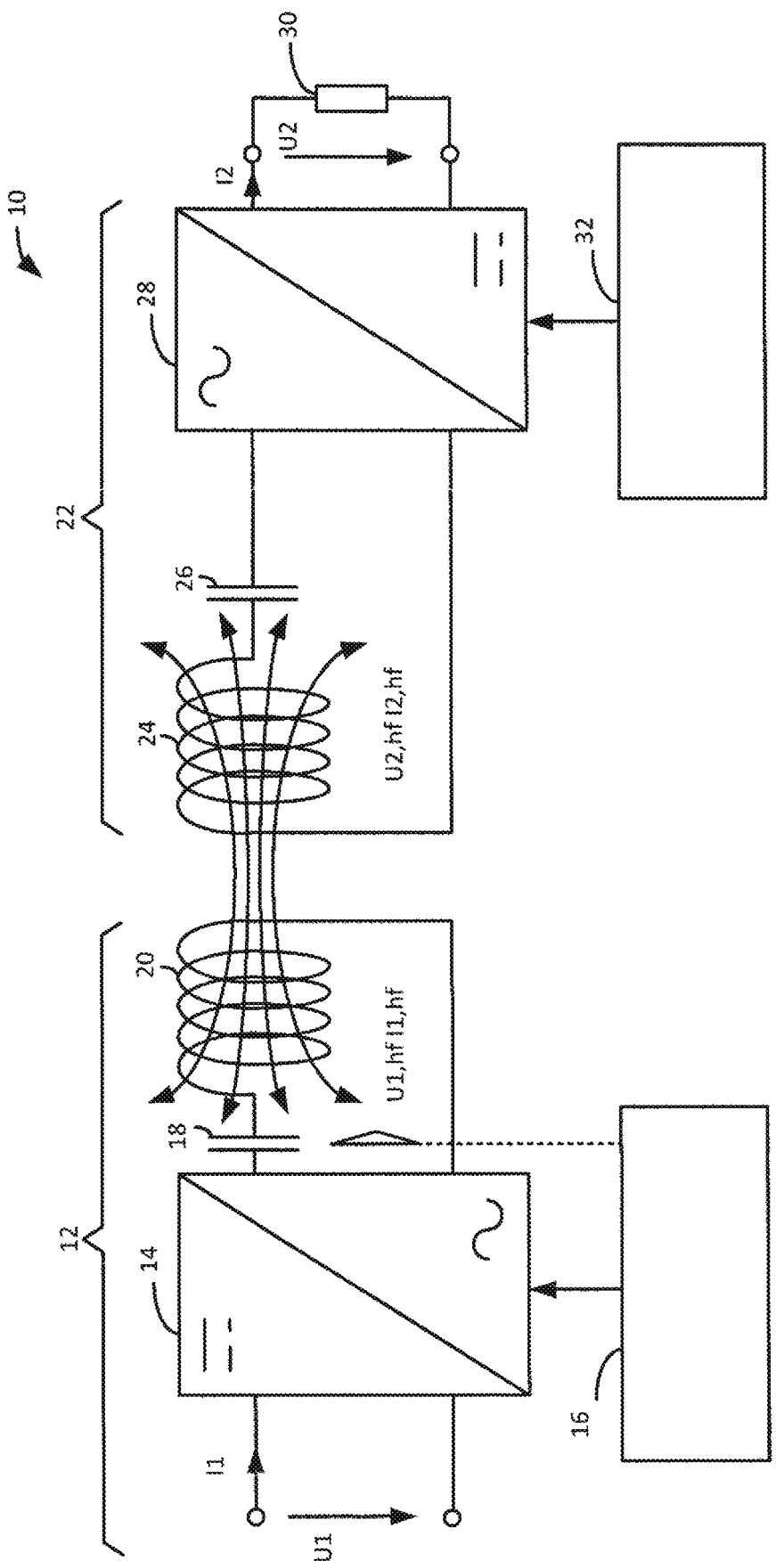
FIG. 2 shows a schematic circuit diagram of an inductive power transfer system according to a first exemplary embodiment of the present invention.

FIG. 2 shows a schematic diagram of an inductive power transfer system 10 according to a first exemplary embodiment of the present invention.

As shown in FIG. 2, the inductive power transfer system 10 has a transmission unit 12 at the primary side. The transmission unit 12 comprises a primary side DC/AC converter 14, a primary side controller 16, a primary side compensation capacitor 18, and a transmitter coil 20 connected in series to the primary side compensation capacitor 18. The series connection of the primary side compensation capacitor 18 and the transmitter coil 20 is connected to the output side of the primary side DC/AC converter 14.

Operatively, the primary side DC/AC converter 14 is adapted to receive a primary side dc voltage $U_{1,dc}$ and a primary side direct current $I_{1,dc}$ as input and to convert it into a primary side high frequency voltage $U_{1,hf}$ and a primary side high frequency current $I_{1,hf}$. The primary side high frequency voltage $U_{1,hf}$ and the primary side high frequency current $I_{1,hf}$ are then supplied to the series connection of the primary side compensation capacitor 18 and transmitter coil 20 for generation of an oscillating magnetic field.

Operatively, the primary side controller 16 is adapted to measure the primary side high frequency current $I_{1,hf}$ and optionally the primary side high frequency voltage $U_{1,hf}$, the primary side direct current $I_{1,dc}$ and/or the primary side dc voltage $U_{1,dc}$. The primary side controller 16 is adapted to process a measurement result for control of the primary side DC/AC converter 14. The primary side DC/AC converter is adapted to supply the primary side high frequency voltage $U_{1,hf}$ and the primary side high frequency current $I_{1,hf}$ to the series connection of the primary side compensation capacitor 18 and the transmitter coil 20. The control of the primary side controller 16 is such that the magnetic field generated by the transmitter coil 20 oscillates at resonant frequency of the series connection of the primary side compensation capacitor 18 and the transmitter coil 20.

As shown in FIG. 2, the inductive power transfer system 10 also has at least one receiving unit 22 separated from the transmission unit 12.

As shown in FIG. 2, the receiving unit 22 comprises a receiver coil 24 connected in series to a secondary side compensation capacitor 26. The receiving unit 22 further comprises a secondary side AC/DC converter 28. At an input side of the secondary side AC/DC converter 28 there is connected the series connection of the receiver coil 24 and the secondary side compensation capacitor 26. At the output side of the secondary side converter 28 there is connected a load 30. The receiving unit 22 comprises a secondary side controller 32 adapted to control the secondary side AC/DC converter 28.

Operatively, the receiver coil 24, when placed in the magnetic field produced by the transmitter coil 20, receives energy transmitted by the transmitter coil 20 through inductive coupling. The inductive coupling leads to generation of a secondary side high frequency voltage $U_{2,hf}$ and a secondary side high frequency current $I_{2,hf}$.

Operatively, the secondary side AC/DC converter 28 is adapted to convert the secondary side high frequency voltage $U_{2,hf}$ and the secondary side high frequency current $I_{2,hf}$ into a secondary side dc voltage $U_{2,dc}$ and a secondary side direct current $I_{2,dc}$ under control of the secondary side controller 32.

Operatively, the secondary side controller 32 is adapted to optionally measure the secondary side high frequency current $I_{2,hf}$ and to optionally measure the secondary side high frequency voltage $U_{2,hf}$, the secondary side direct current $I_{2,dc}$ and/or the secondary side dc voltage $U_{2,dc}$. The secondary side controller 32 is adapted to process a measurement result for controlling the secondary side AC/DC converter 28. The secondary side AC/DC converter 28 is adapted to supply the secondary side dc voltage $U_{2,dc}$ and the secondary side direct current $I_{2,dc}$ to the load 30, e.g., either directly or via a DC/DC converter (not shown in FIG. 2).

As shown in FIG. 2, according to the present invention the provision of a wireless communication link between the primary side and the secondary side or the provision of a dedicated short circuit protection switch is not mandatory.

Generally, according to the first exemplary embodiment of the present invention the primary side controller 16 is adapted to detect operating conditions at the secondary side through intrinsic analysis of electric signals over time which are available on the primary side which are dynamically coupled to operating conditions at the secondary side.

E.g., due to the inductive coupling the occurrence of a change of an operating condition at the secondary side will lead to a transient characteristic of the primary side high frequency voltage $U_{1,hf}$ and/or the primary side high frequency current $I_{2,hf}$ Further, according to the first exemplary embodiment the primary side controller 16 is adapted to control the inductive power transfer system 10 in response to detected operating conditions. In more detail, the primary side controller is adapted to control, e.g., the primary side dc voltage $U_{1,dc}$, the primary side direct current $I_{1,dc}$, the primary side high frequency voltage $U_{1,hf}$ and/or the primary side high frequency current $I_{1,hf}$ such that the secondary side of the inductive power transfer system enters a safe state upon occurrence of predetermined operating conditions at the secondary side of the inductive power transfer system.

In the most general sense, according to the present invention the operating condition at the secondary side of the inductive power transfer system is related to a change from a regular operating condition to a non-regular operating condition. Further, in the most general sense the second non-regular operating condition is an open circuit condition or a short circuit condition at the secondary side of the inductive power transfer system. Further examples of non-regular operating conditions are e.g., an over current, an over temperature, high impedance state, and/or low impedance state at the secondary side.

Figure 3:
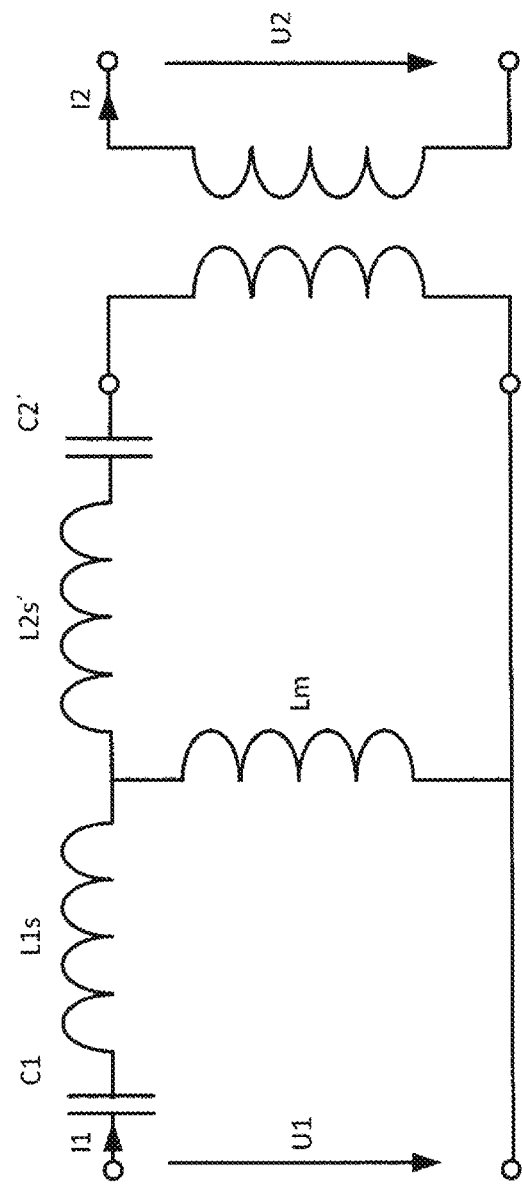
FIG. 3 shows an equivalent circuit diagram of a transformer of the inductive power transfer system shown in FIG. 2.

FIG. 3 shows an equivalent circuit diagram of a transformer constituted by the transmitter coil 20 and the receiver coil 24 in the inductive power transfer system 10 using series-series compensation.

As shown in FIG. 3, $L_{1s}$ and $L_{2s}'$ represent the leakage inductances of the transformer and $L_m$ is the mutual inductance of the transformer. The inductances of the transmitter coil 20 is $L_1 = L_{1s} + L_m$ and the inductance of the receiver coil 24 is $L_2 = L_{2s}' + L_m$. If the primary side compensation capacitor 18 and the secondary side compensation capacitor 26 are dimensioned to compensate the self-inductance of the transmitter coil 20 and the self-inductance of the receiver coil 24, respectively, the inductive power transfer system 10 is operated at a resonant frequency $$f_0 = \frac{1}{2\pi\sqrt{L_1 C_1}} = \frac{1}{2\pi\sqrt{L_2 C_2}}$$

and the secondary side appears as a current source with a magnitude $$I_{2,hf} = \frac{U_{1,hf}}{2\pi f_0 L_{12}}.$$

If an open circuit error occurs, the secondary side high frequency voltage $U_{2,hf}$ will increase to levels that could be destructive to components and even be dangerous.

More generally, depending on the compensation strategy of the transmitter coil 20 and the receiver coil 24 and the frequency they are driven relative to their resonant frequency, the power delivered to the secondary side appears as a voltage source, a current source or a mix of the two. In the case of an equivalent voltage source the safe state on the secondary side is an open circuit. In the case of a current source the safe state is a short circuit.

Generally, the primary side controller 16 according to the first exemplary embodiment of the present invention is adapted to control the operation at the primary side of the inductive power transfer system 10 such that secondary side enters the safe state upon occurrence of an error condition at the secondary side without exchange of control data and/or measurement data between the primary side and the secondary side.

Figure 4:
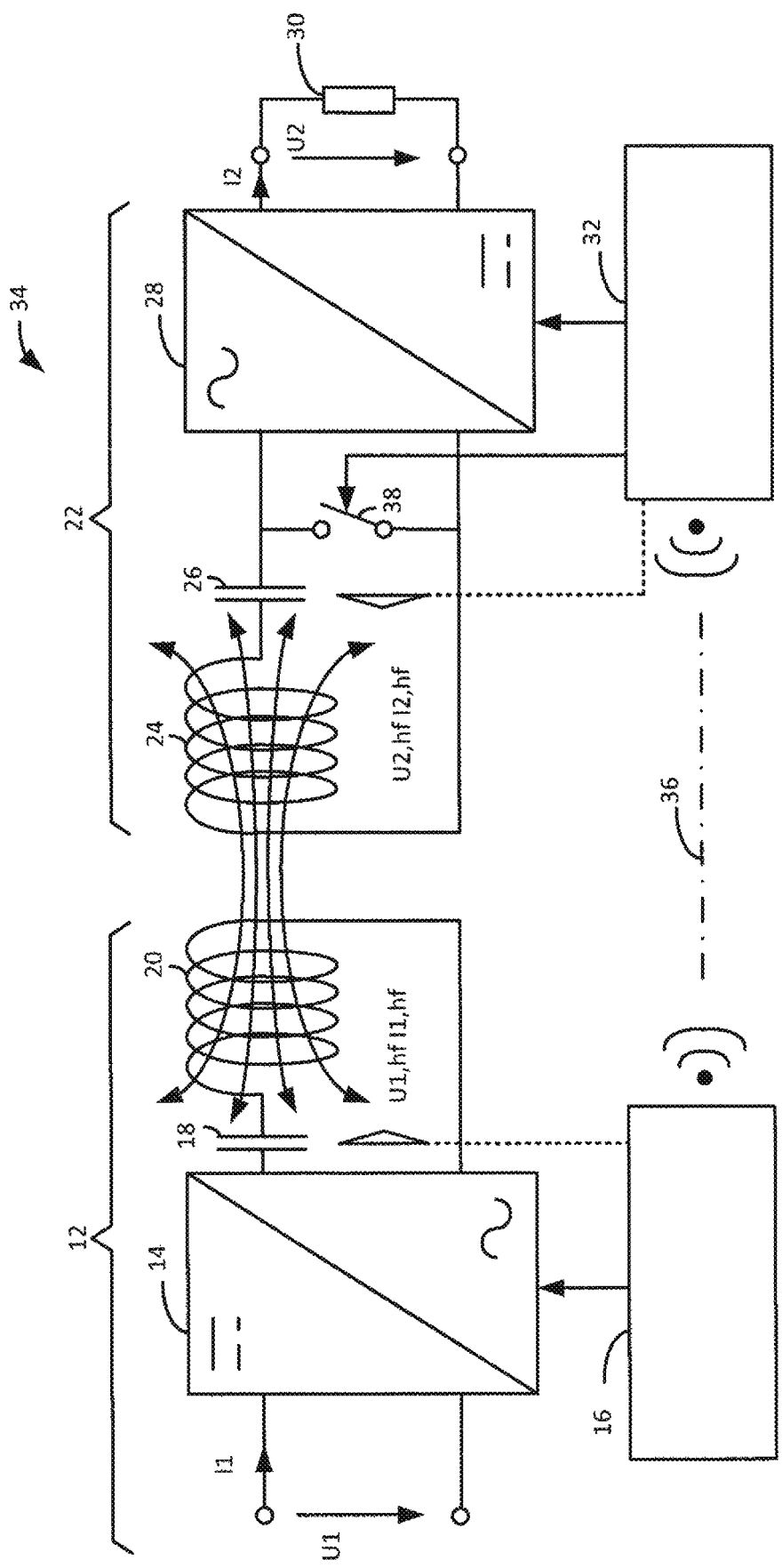
FIG. 4 shows a schematic circuit diagram of an inductive power transfer system according to a second exemplary embodiment of the present invention.

FIG. 4 shows a schematic circuit diagram of an inductive power transfer system 34 according to a second exemplary embodiment of the present invention.

Insofar as the inductive power transfer system 34 according to the second exemplary embodiment of the present invention uses the same circuit components as the inductive power transfer system 10 according to the first exemplary embodiment of the present invention, they are referenced using the same reference numerals and explanation of related structure and functionality is not repeated here.

As shown in FIG. 4, the inductive power transfer system 34 according to the second exemplary embodiment of the present invention comprises a wireless transmission link 36 for exchange of measurement data and/or control data between the primary side and the secondary side or vice versa.

As shown in FIG. 4, the inductive power transfer system 34 according to the second exemplary embodiment of the present invention further comprises a short circuit protection switch 38 at the secondary side. The short circuit protection switch 38 is connected to the input of the secondary side AC/DC side converter 28 parallel to the series resonant circuit constituted by the receiver coil 24 and the secondary side compensation capacitor 26.

In the following further aspects of the analysis of the operating conditions at the secondary side of the inductive power transfer system 10, 34 according to the first and second exemplary embodiment of the present invention will be explained with reference to FIG. 6 to FIG. 17.

Here, it should be noted that explanations given in the following with respect to the analysis of the operating conditions are equally applicable to the inductive power transfer systems 10 and 34 according to the first and second exemplary embodiment of the present invention.

Figure 5:
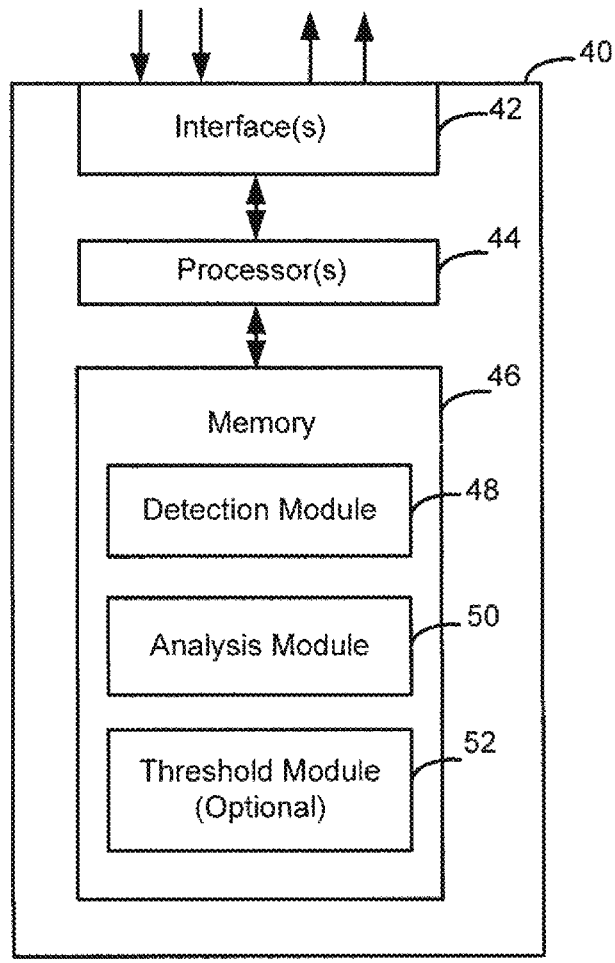
FIG. 5 shows a schematic diagram of an detection apparatus for detecting operating conditions at a secondary side of inductive power transfer systems according to a third exemplary embodiment of the present invention.

FIG. 5 shows a schematic diagram of an detection apparatus 40 for detecting operating conditions at a secondary side of inductive power transfer systems 10, 34 according to a third exemplary embodiment of the present invention.

As shown in FIG. 5, the detection apparatus 40 comprises at least one interface 42, e.g., a radio interface. The interface 42 is suitable for wireless information exchange, e.g., with the secondary side controller of the inductive power transfer system 10, 34, or with an external control station of the inductive power transfer system 10, 34. In some scenarios, the interface 12 may also be used for exchange of information with external systems, e.g., a supervision system operated in a logistics center.

As shown in FIG. 5, the detection apparatus 40 comprises at least one processor 44 coupled to the interface 42 and a memory 46 coupled to the at least one processor 44. The memory 46 may include a read-only memory ROM, e.g., a flash ROM, a random access memory RAM, e.g., a dynamic RAM DRAM or a static RAM SRAM, a mass storage, e.g., a hard disc or solid state disc, or the like. The memory 46 also includes instructions, e.g., suitably configured program code to be executed by the at least one processor 44 in order to implement a later described functionality of the detection apparatus 40. This functionality will be referred to in the following as modules. It is noted that these modules do not represent individual hardware elements of the detection apparatus 40, but rather represent functionalities generated when the at least one processor 44 execute the suitably configured program code.

As shown in FIG. 5, the memory 46 may include suitably configured program code to implement a detection module 48, an analysis module 50, and an optional threshold module 52. Further, the suitably configured program code in the memory 46 may also implement a control module for implementing various control functionalities, e.g., for controlling the detection apparatus 40 so as to establish and/or maintain related functionality and connectivity to the outside, or the like.

Figure 6:
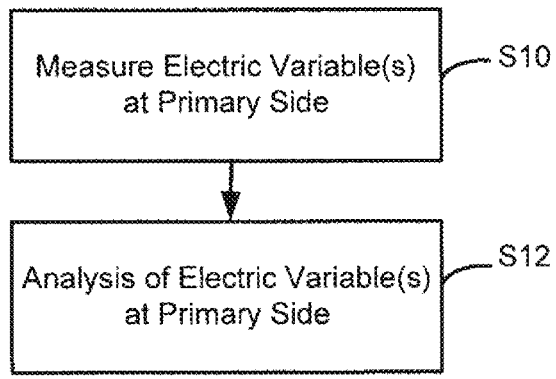
FIG. 6 shows a flowchart of operation of the detection apparatus shown in FIG. 5 according to a fourth exemplary embodiment of the present invention.

FIG. 6 shows a flowchart of operation of the detection apparatus shown in FIG. 5 according to a fourth exemplary embodiment of the present invention, for observing an operating condition at a secondary side of an inductive power transfer system 10, 34.

As shown in FIG. 6, operatively the detection module 48, in cooperation with the processor 44, is adapted to execute a step S10 for measuring of at least one electric variable at a primary side of the inductive power transfer system 10, 34 which is dynamically coupled to the operating condition at the secondary side of the inductive power transfer system 10, 34.

As shown in FIG. 6, operatively the analysis module 50, in cooperation with the processor 44, is adapted to execute a step S12 for implementation of a first analysis of the at least one electric variable over time at the primary side of the inductive power transfer system 10, 34 for detection of the operating condition at the secondary side of the inductive power transfer system 10, 34 without use of measurement data measurable at the secondary side of the inductive power transfer system 10, 34.

Figure 7:
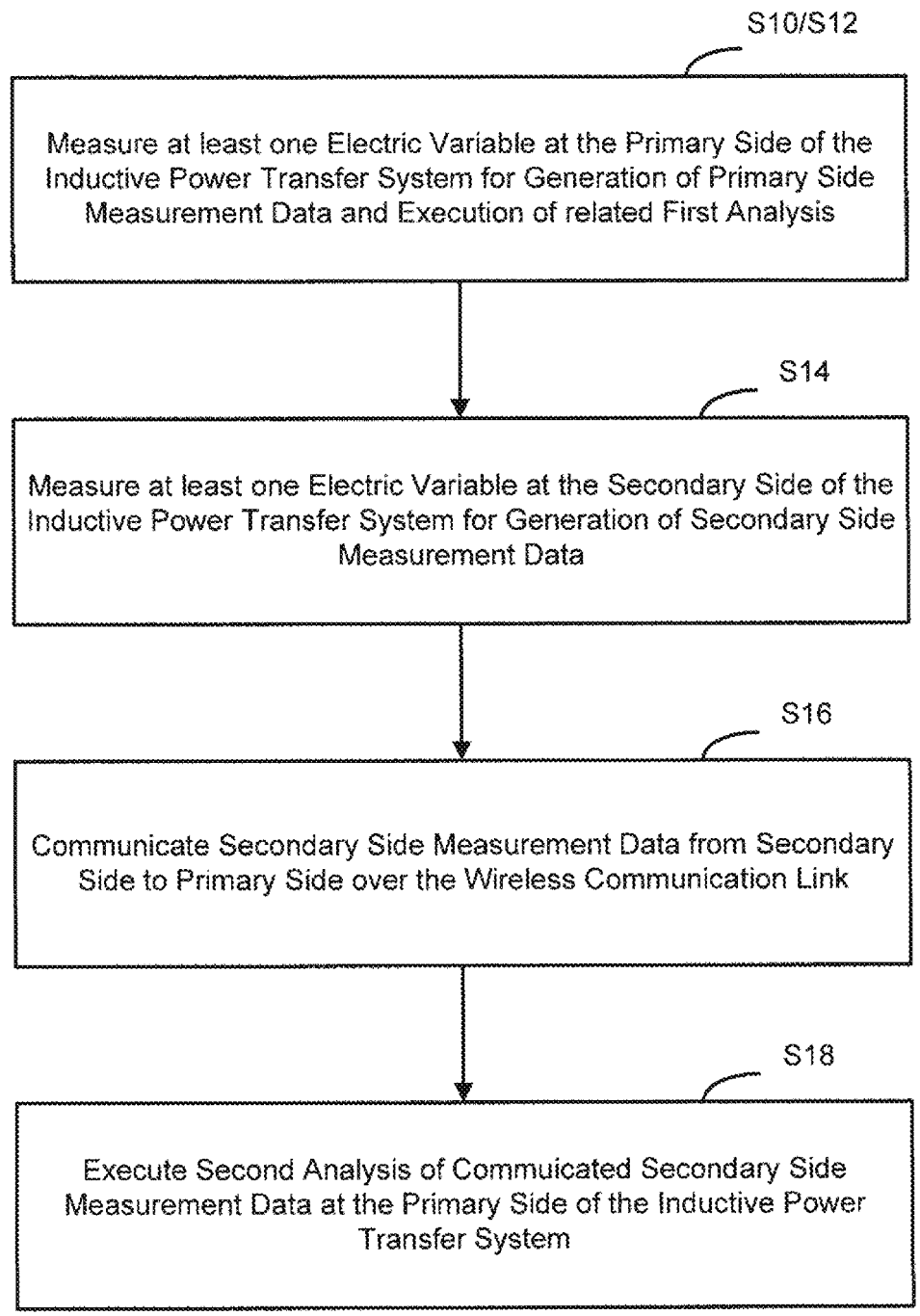
FIG. 7 shows a further detailed flowchart of operation of the detection apparatus shown in FIG. 5 according to a fifth exemplary embodiment of the present invention.

FIG. 7 shows a further detailed flowchart of operation of the detection apparatus 40 shown in FIG. 5.

As shown in FIG. 7, operatively the detection apparatus shown in FIG. 5 is adapted to execute the steps S10 and S12 for detection of the at least one electric variable at the primary side of the inductive power transfer system and for execution of related first analysis.

As shown in FIG. 7, operatively the secondary side controller 32 is adapted to execute a step S14 for measurement of at least one electric variable at the secondary side of the inductive power transfer system 34 over time for generation of secondary side measurement data in relation to the operating condition at the secondary side of the inductive power transfer system 34.

As shown in FIG. 7, operatively the secondary side controller 32 is adapted to execute a step S16 for communication of the generated secondary side measurement data from the secondary side of the inductive power transfer system 34 to the primary side of the inductive power transfer system 34 over the wireless transmission link 36.

As shown in FIG. 7, operatively the primary side controller 16 is adapted to execute a step S18 to realize a second analysis of the communicated secondary side measurement data over time at the primary side of the inductive power transfer system 34 in combination with the first analysis for a more accurate and/or an accelerated detection of the operating condition at the secondary side of the inductive power transfer system 34.

It should be noted that according to the present invention the execution of the first analysis and the execution of the second analysis may as well be assigned to the primary side controller 16 and the secondary side controller 32 in parallel to realize a parallelized analysis process. Yet a further variation would be to supplement the control of the inductive power transfer system 34 from the primary side by a decoupled control at the secondary side through the secondary side controller 32, e.g., actuation of the short circuit protection switch 38 upon occurrence of an error state at the secondary side.

Further, the specific order of the steps S10 to S18 as shown in FIG. 7 is to be considered as an example only and it should be understood that any revision of this order is as well covered by the scope of the present invention.

In the following more detailed aspects of the detection of operating conditions in the inductive power transfer system for improved control of the power transfer system will be explained.

Figure 7A:
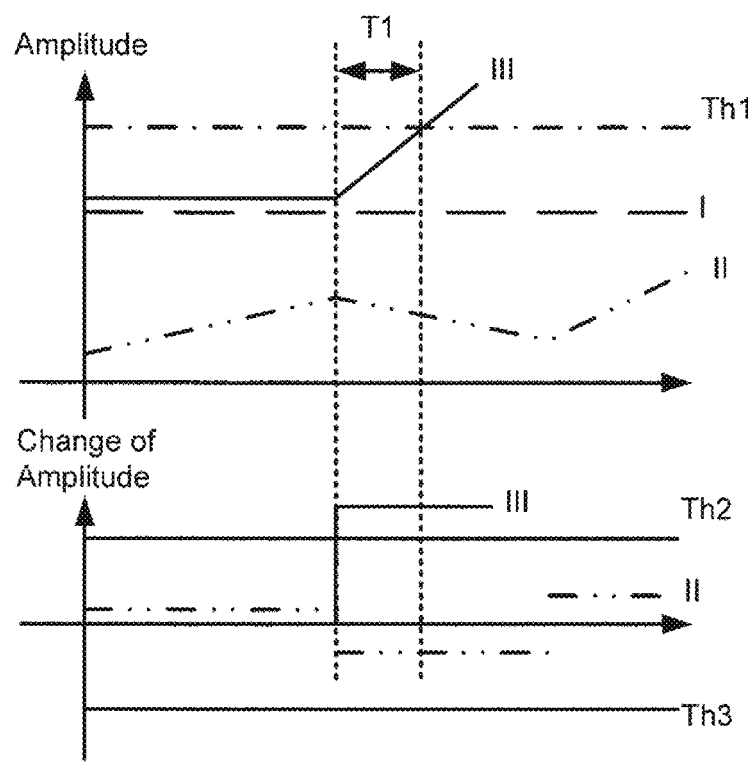
FIG. 7a shows different operating conditions in relation to a variation of an electrical variable and its maximum allowable amplitude reflected by a threshold.

FIG. 7a shows different operating conditions in relation to a variation of an electrical variable and its maximum allowable amplitude reflected by a threshold.

As shown in FIG. 7a, according to the present invention there may be considered a rate of change of at least one electric variable instead of the actual value of the at least one electric variable.

FIG. 7a illustrates the implications of this feature through non-binding example scenarios. As shown in the upper part of FIG. 7a, there are three operating scenarios (I) to (III) in relation to the changing amplitude of an electric variable and its maximum allowable amplitude reflected by a threshold value Th1:

(I) Amplitude remains constant and lower than threshold Th1;
(II) Amplitude changes over time but remains lower then threshold Th1; and
(III) Amplitude changes over time and exceeds threshold Th1.

Here, FIG. 7a shows that for scenario (I) and the threshold Th1 is not exceeded wherein for scenario (III) eventually the threshold of Th1 is exceeded after elapse of a time period T1.

The lower part of FIG. 7a shows the rates of change for the different scenarios. For scenario (I) there is no change of amplitude while for scenario (II) the rate of change stays within an upper bound Th2 and a lower bound Th3. Further, for the scenario (III) the increase in the amplitude is too high and the rate of change for the amplitude exceeds the upper bound Th2.

As shown in the lower part of FIG. 7a the information that a rate of change exceeds its related threshold is immediately available without delay of a time period T1 until the actual amplitude of the considered electrical value exceeds the threshold Th1. The reason for this is that the rate of change is related to the amplitude differential of the electrical value considered and not to the amplitude of the electrical value.

Thus, when considering the rate of change of an electrical value the present invention achieves the technical effect of an accelerated detection of an operative state at the secondary side of the inductive power transfer system.

Figure 7B:
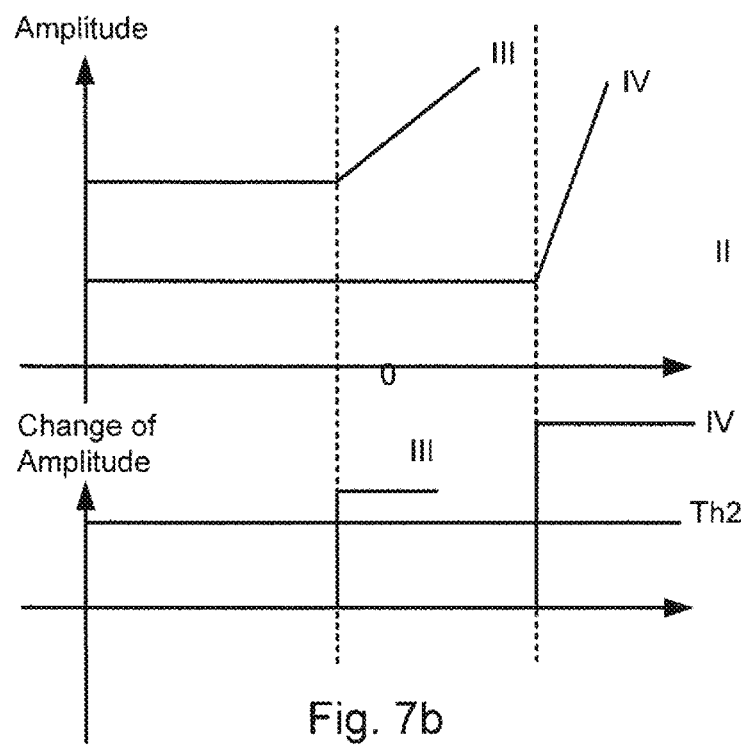
FIG. 7b shows that a rate of change of a detected electric variable is independent from the amplitude of the detected variable and thus may be detected independently from the amplitude.

A further implication of the consideration of the rate of change of an electrical value is illustrated by FIG. 7b.

FIG. 7b shows the rate of change of a detected electric variable is independent from the amplitude of the considered electrical variable and thus may be detected independently from the amplitude. As shown in FIG. 7b, while in scenario (III) the amplitude is higher than in scenario (IV), nevertheless the actual rate of change in scenario (III) is lower than the one in scenario (IV).

From FIG. 7b it should be clear that according to the present invention a fixed threshold scheme may be used. Thus, irrespective of the actual amplitude it is possible to compare the rate of change for case (III) or (IV) with a same threshold Th2 which is set once for indication of a specific operation state at the secondary side of the inductive power transfer system and need not be modified during operation. This leads to a facilitation of the process of detection of the operating condition at the secondary side of the power transfer system.

In conclusion and as explained with respect to FIG. 7a and FIG. 7b, the present invention may increase level of safety through improved detection of operating conditions at the secondary side of an inductive power transfer system while and the same time it reduces costs of system implementation.

Figure 8:
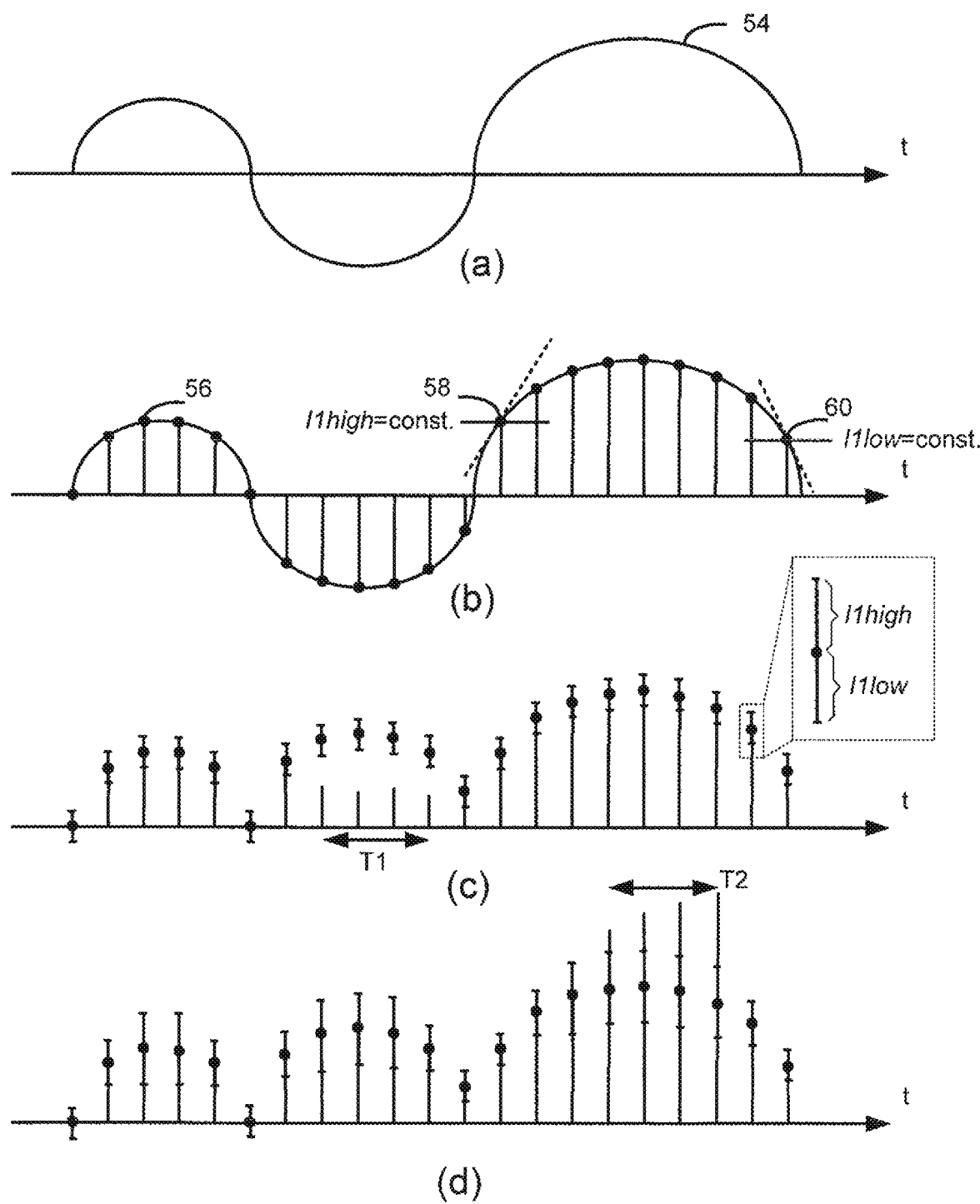
FIG. 8 shows further aspects of sampling and measuring at least one electric variable at the primary side of the inductive power transfer system according to the present invention.

FIG. 8 shows further aspects of sampling and observing at least one electric variable at the primary side of the inductive power transfer system.

As shown in FIG. 8, according to the present invention the detection module 48, in cooperation with the processor, is adapted to measure the at least one electric variable 54 over time at the primary side of the inductive power transfer system by determining sample values 56 of the at least one electric variable and/or a value being based on the at least one electric variable.

Further, as shown in FIG. 8, the analysis module 50, in cooperation with the processor 44, is adapted to execute the first analysis of the at least one electric variable and/or the value being based on the at least one electric variable using the sample values 56 and a predetermined threshold scheme.

As shown in FIG. 8(*a*), according to the present invention the at least one electric variable is not restricted to any specific electric characteristic and may be selected as single electric variable or as a combination of electric variables from a group comprising:
- a primary side current and/or at least one first value based on the primary side current,
- a rate of change of the primary side current and/or at least one second value based on the rate of change of the primary side current,
- an electric power supplied to the primary side of the inductive power transfer system and/or at least one third value based on the electric power supplied to the primary side of the inductive power transfer system, e.g., a signal based on the power delivered to the primary side coil ($I_{1,hf} * U_{1,hf}$) or the primary side DC/AC converter ($I_{1,dc} * U_{1,dc}$),
- a rate of change of an electric power supplied to the primary side of the inductive power transfer system and/or at least one fourth value based on the rate of change of the electric power supplied to the primary side of the inductive power transfer system,
- a phase difference between a primary side voltage and the primary side current and/or at least one fifth value based on the phase difference between the primary side voltage and the primary side current,
- a rate of change of the phase difference between the primary side current and the primary side voltage and/or at least one sixth value based on the rate of change of the phase difference between the primary side current and the primary side voltage,
- a resonant frequency at the primary side of the inductive power transfer system and or at least seventh value based on the resonant frequency at the primary side of the inductive power transfer system.

Here, it should be noted that a value based on an electric variable as exemplified above according to the present invention is not restricted in any form and may be a peak value of the electric variable, an rms value of the electric variable, or any other suitable value derived by a functional operation of the electric variable.

As shown in FIG. 8(*b*) to FIG. 8(*d*), according to the present invention there are provided a plurality of methodologies to execute the first analysis using different threshold schemes to be explained in the following.

Generally, according to the present invention a threshold scheme comprises at least one of a threshold which is a fixed threshold, an adaptive threshold, or a combination of a fixed threshold and an adaptive threshold.

As shown in FIG. 8(*b*), a first option to execute the first analysis of the at least one electric variable is the use of fixed threshold values which do not vary over time.

As shown in FIG. 8(*b*), according to the first option of the first analysis there is set a first threshold 58 and a rising edge crossing of a first threshold 58 by a sample value of the sample values of the at least one electric variable or of the related value serves for detection of a first operating condition at the secondary side of the inductive power transfer system 10, 34, e.g., an open circuit condition at the secondary side of the inductive power transfer system 10, 34.

As shown in FIG. 8(*b*), according to a second option of the first analysis there is set a second threshold 60 and a falling edge crossing of the second threshold by the peak value of the sample values of the at least one electric variable or related value serves for detection of a second operating condition at the secondary side of the inductive power transfer system 10, 34, e.g., a short circuit condition at the secondary side of the inductive power transfer system 10, 34.

As shown FIG. 8(*c*), according to a third option of the first analysis the at least one electric variable is the primary side current. The third option of the first analysis comprises a step of sampling the primary side current and a step of analyzing absolute values $I_{1hf\_abs}(k)$ of sample values of the primary side current using a threshold scheme dividing into a first lower threshold $I_{1low}(k)$ and a second higher threshold $I_{1high}(k)$ according to $$I_{1low}(k) < I_{1hf\_abs}(k) < I_{1high}(k)$$

$$I_{1low}(k) = g_m U_{2,hf}(k) - a(k)$$

$$I_{1high}(k) = g_m U_{2,hf}(k) + b(k)$$

wherein $$g_m = \frac{1}{2\pi f_0 L_{12}}$$

is the trans-conductance, $f_0$ is the resonant frequency at the primary side of the inductive power transfer system 10, 34, and L12 is the mutual inductance or a representative value for the trans-conductance; and $U_{2,hf}(k)$ is the secondary side high frequency voltage of the inductive power transfer system;

a(k) is a lower bound for observing regular operation at the secondary side of the inductive power transfer system in relation to $g_m U_{2,hf}(k)$; and b(k) is a upper bound for observing regular operation at the secondary side of the inductive power transfer system in relation to $g_m U_{2,hf}(k)$.

As shown in FIG. 8(*c*) according to third option of the first analysis the values of a(k) and b(k) are constant over time. This facilitates the process of detection of the operating condition at the secondary side of the inductive power transfer system 10, 34.

As shown in FIG. 8(*d*) according to a fourth option of the first analysis the values of a(k) and b(k) are adaptive over time.

According to the present invention the values of a(k) and b(k) may be adaptive, e.g., according to current state of the signal to be measured, e.g., amplitude, frequency, sign of signal, etc.

Generally, the values of a(k) and b(k) should reflect a balance between a small value for fast detection of a change of operating conditions at the secondary side of the inductive power transfer system 10, 34 a value large enough to avoid faulty detection by providing enough error tolerance.

Further, an adaptive setting of the values of a(k) and b(k) allows to maintain relative tolerance for detection of operating conditions irrespective of amplitude changes of the signal to be measured or related values derived therefrom for detection.

As shown in FIG. 8(*c*) and FIG. 8(*d*), according to the third and fourth option, in the first analysis there is detected the short circuit condition at the secondary side of the inductive power transfer system 10, 34 when absolute values $I_{1hf\_abs}(k)$ of the sample values of the primary side current are lower than the first lower threshold $I_{1low}(k)$ over a first predetermined period of time T1.

As shown in FIG. 8(*c*) and FIG. 8(*d*), according to the third and fourth option, in the first analysis there is detected the open circuit condition at the secondary side of the inductive power transfer system 10, 34 when the absolute values $I_{1hf\_abs}(k)$ of the sample values of the primary side current are higher than the second higher threshold $I_{1high}(k)$ over a second predetermined period of time T2.

Figure 9:
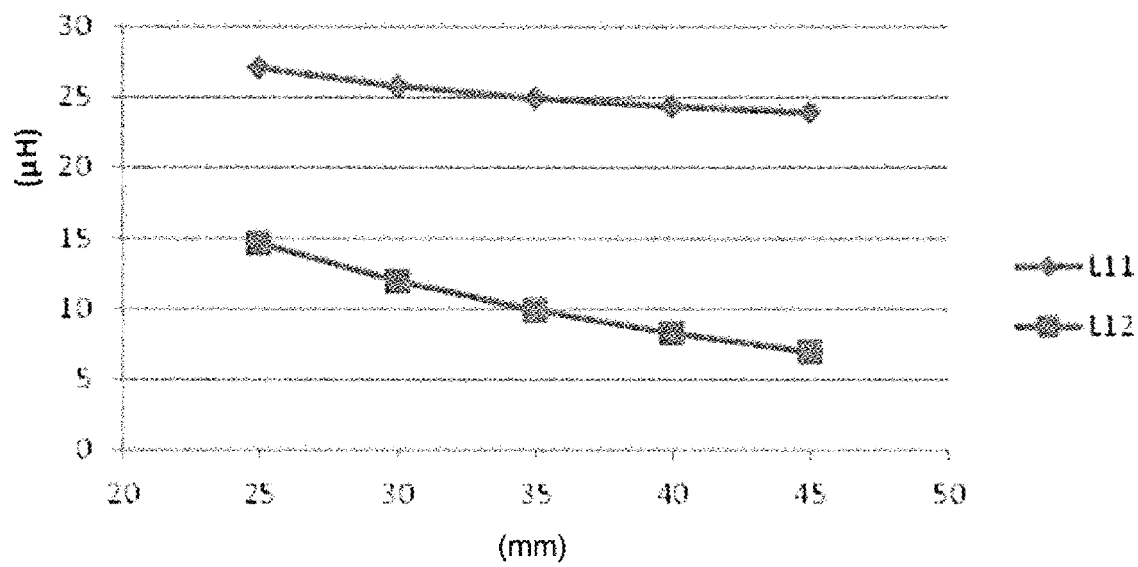
FIG. 9 shows a variation of self-inductances and mutual inductances as a function of vertical separation between the transmitter coil and the receiver coil.

FIG. 9 shows a variation of self-inductances and mutual inductances as a function of vertical separation between the transmitter coil 20 and the receiver coil 24.

As shown in FIG. 9, the mutual inductance L12 decreases with increasing vertical separation between the transmitter coil 20 and the receiver coil 24. Further, the trans-conductance gm is inversely proportional to the mutual inductance L12. This is the basis for the adaptive setting of the values of a(k) and b(k).

As outlined above, the lower threshold $I_{1low}(k)$ and thus the value of a(k) triggers detection of a short circuit operating condition at the secondary side of the inductive power transfer system 10, 34.

Also, the upper threshold $I_{1high}(k)$ and thus the value of b(k) triggers the detection of an open circuit operating condition at the secondary side of the inductive power transfer system 10, 34.

It is the variation of the mutual induction L12 or equivalently the variation of the trans-conductance that determines the variation characteristics of the primary side current and the adaptation of the values of a(k) and b(k).

Figure 10:
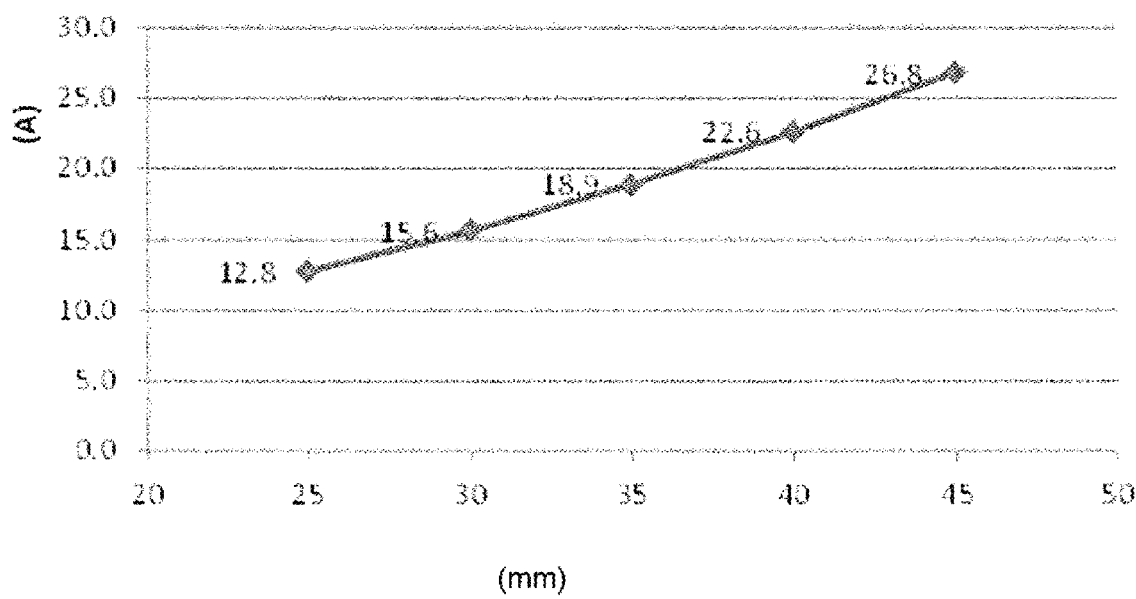
FIG. 10 shows a variation of an induced primary current as a function of vertical separation between the transmitter coil and the receiver coil at a constant secondary side voltage.

FIG. 10 shows a variation of an induced primary current as a function of vertical separation between the transmitter coil 20 and the receiver coil 24 at a constant secondary side voltage.

As shown in FIG. 10, the induced primary side current increases with increasing vertical separation as the mutual inductance L12 decreases with increasing vertical separation and as the trans-conductance gm is inversely proportional to the mutual inductance L12.

As outlined above, the tolerance band for the error detection may be adaptive. Therefore, according to the present invention a decrease of the amplitude of the primary side current implies a decrease of the values of a(k) and b(k) in line with a decrease of vertical separation between the transmitter coil 20 and the receiver coil 24. Further, an increase in the amplitude of the primary side current implies an increase in the values of a(k) and b(k) in line with an increase of vertical separation between the transmitter coil 20 and the receiver coil 24.

Figure 11:
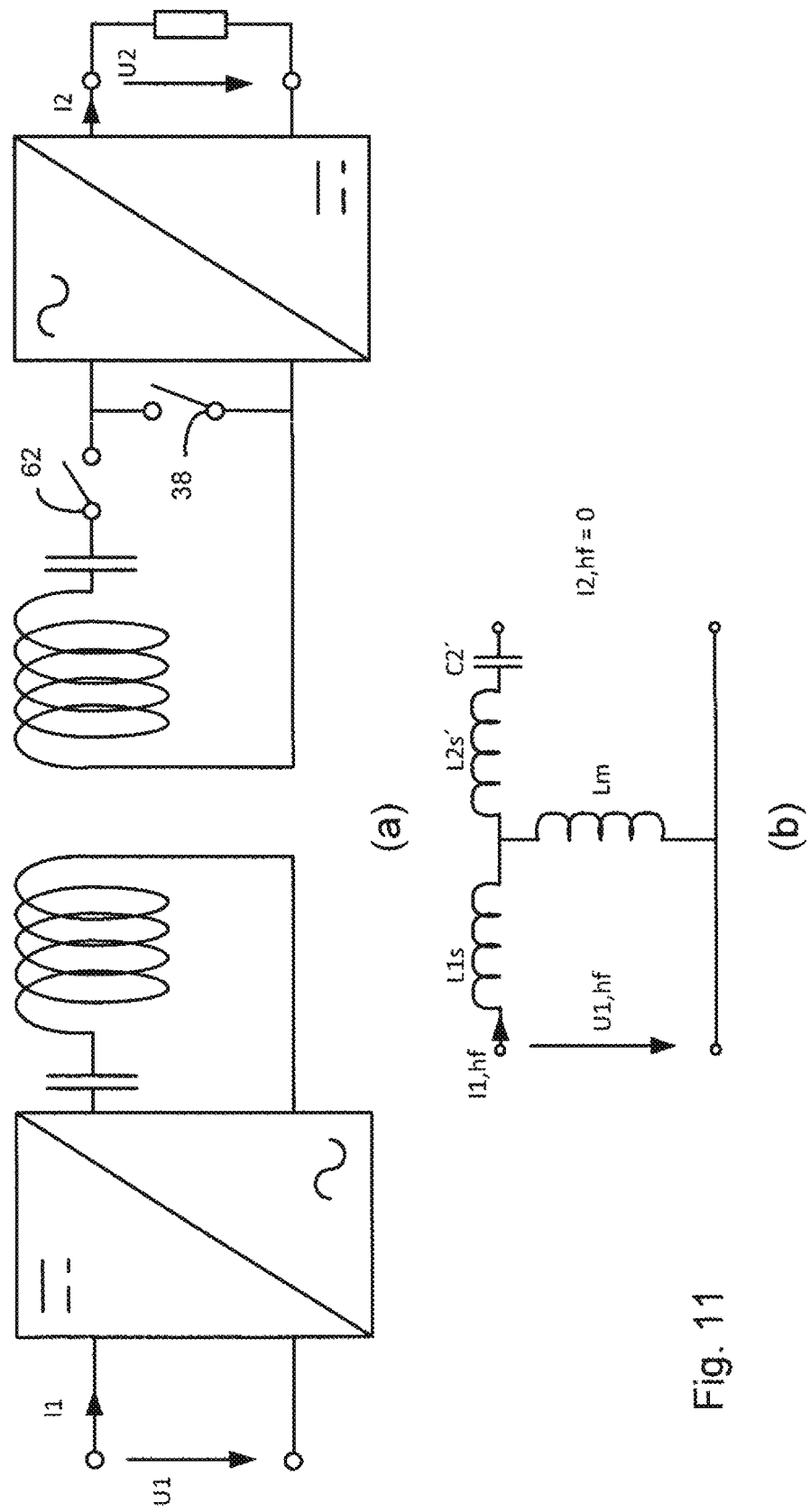
FIG. 11 shows a schematic diagram according to a first operating condition of the inductive power transfer system according to the present invention and a related equivalent circuit diagram.

FIG. 11 shows a schematic diagram according to a first operating condition of the inductive power transfer system according to the present invention and a related equivalent circuit diagram.

As shown in FIG. 11(a), the first operating condition relates to a disconnection of the secondary side AC/DC converter 28 and the receiver coil 24.

As shown in FIG. 11(a), the first operating condition may be represented by an opening of a first model switch 62 inserted at a location of the possible disconnection of the secondary side AC/DC converter 28 and the receiver coil 24.

As shown in FIG. 11(a), should the first operating condition materialize, then the short circuit protection switch 38 may no longer protect the receiver coil 24 from over voltage.

As shown in FIG. 11(b), according to the equivalent circuitry modelling the first operating condition the disconnection of the secondary side AC/DC converter 28 and the receiver coil 24 leads to a mere inductive load as seen from the primary side and thus to a phase shift. Also the parallel branch carries no current such that $I_{1,hf}=0$ applies and the impedance as seen from the primary side goes up.

Figure 12:
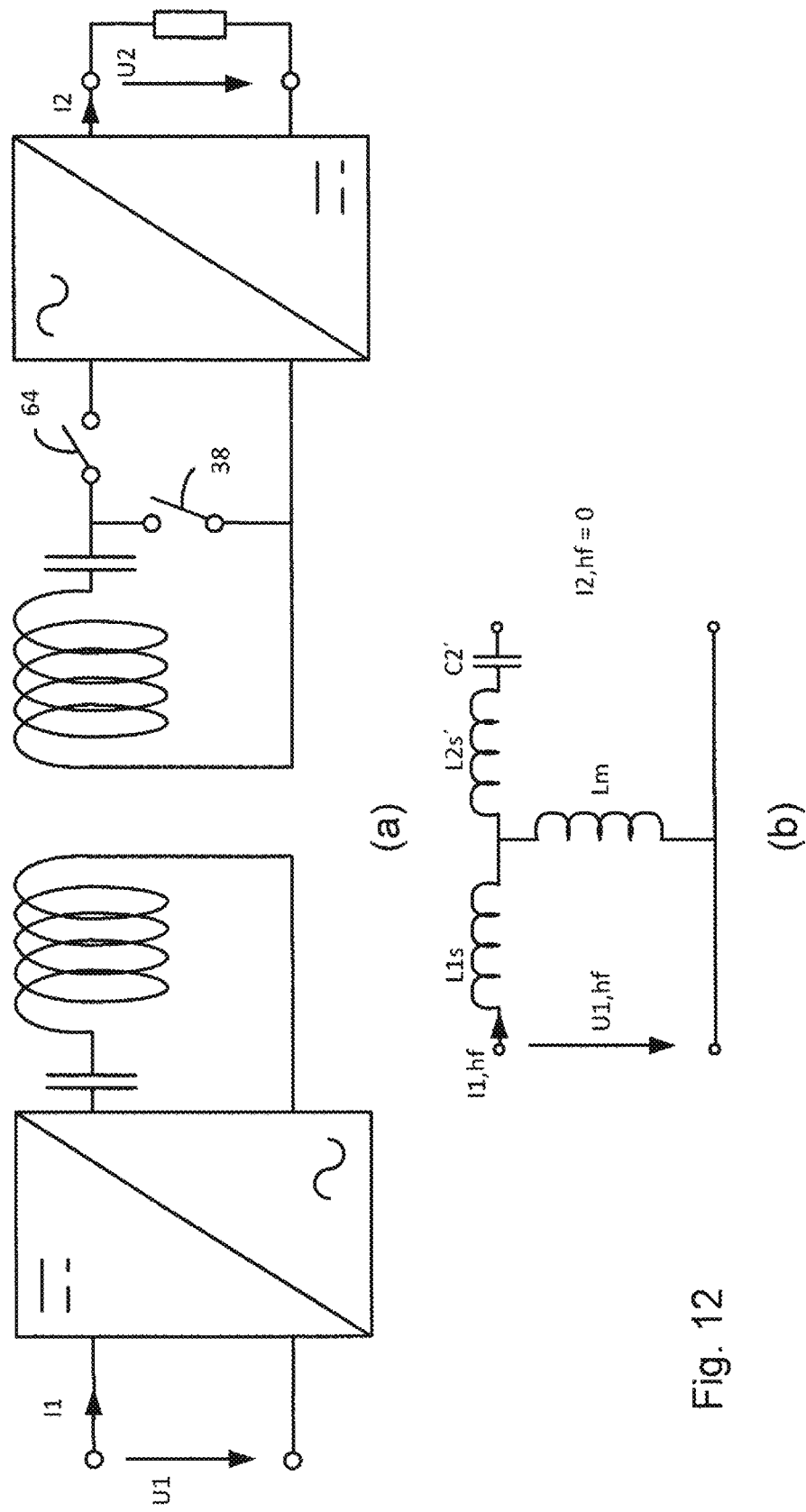
FIG. 12 shows a schematic diagram according to a second operating condition of the inductive power transfer system according to the present invention and a related equivalent circuit diagram.
Figure 13:
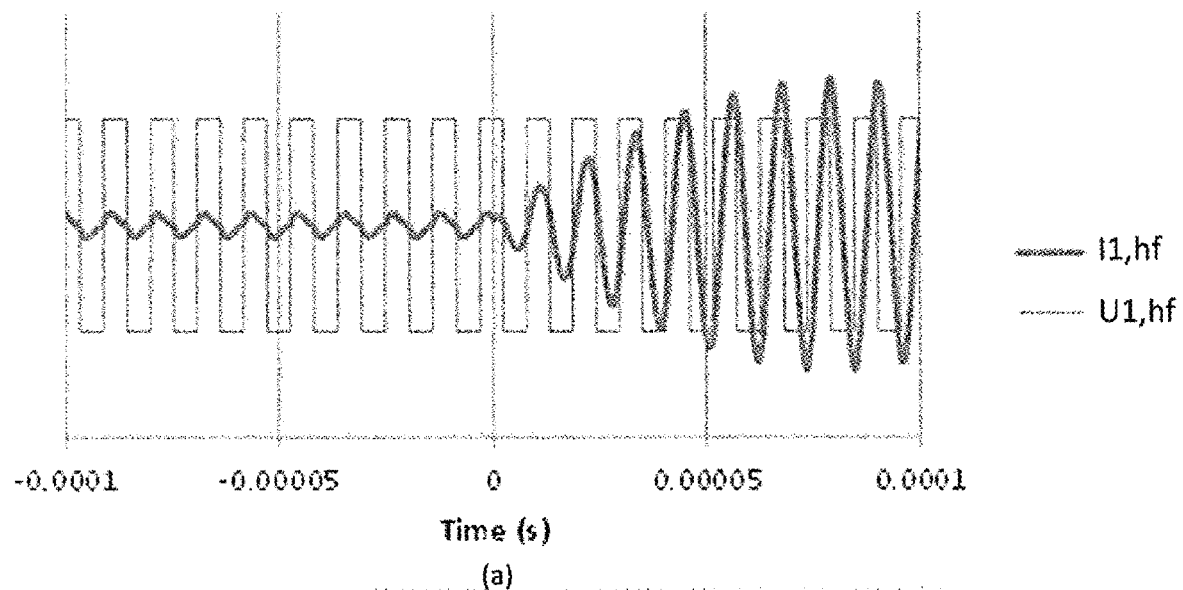
FIG. 13(a) shows a primary side high frequency current and a primary side high frequency voltage according to the first operating condition of the inductive power transfer system illustrated in FIG. 11 or according to the second operating condition of the inductive power transfer system shown in FIG. 12.
FIG. 13(b) shows a secondary side high frequency current and a secondary side high frequency voltage according to the first operating condition of the inductive power transfer system illustrated in FIG. 11 or according to the second operating condition of the inductive power transfer system shown in FIG. 12.
Figure 13:
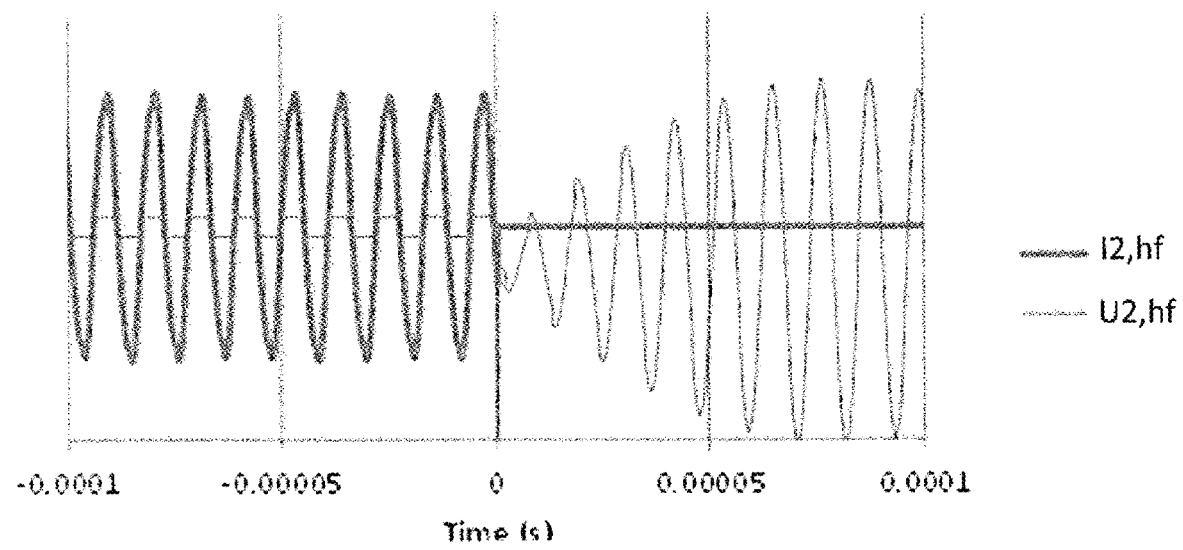

FIG. 12 shows a schematic diagram according to a second operating condition of the inductive power transfer system according to the present invention and a related equivalent circuit diagram.

As shown in FIG. 12(a), the second operating condition relates to a disconnection of the secondary side AC/DC converter 28 from the short circuit protection switch 38.

As shown in FIG. 12(a), the second operating condition may be represented by an opening of a second model switch 64 inserted at a location of a possible disconnection of the secondary side AC/DC converter 28 from the short circuit protection switch 38. Should the second operating condition materialize, then the short circuit protection switch 38 may still protect the receiver coil 24 from over voltages.

As shown in FIG. 12(b), the equivalent circuitry modelling the second operating condition is similar to the equivalent circuit modelling the first operating condition and thus similar explanations as given above apply.

As shown in FIG. 12, if an open circuit occurs represented by an opening of the second model switch 64, this second operating condition could be detected by the secondary side controller 32 and the short circuit protection switch 38 may be closed. The primary side controller 16 may then detect either the second open circuit condition or the following short circuit condition triggered by closing the short circuit protection switch or both.

FIG. 13(a) shows the primary side high frequency current $I_{1,hf}$ and a primary side high frequency voltage $U_{1,hf}$ according to the first operating condition of the inductive power transfer system illustrated in FIG. 11 or according to the second operating condition of the inductive power transfer system shown in FIG. 12.

As shown in FIG. 13(a), upon entry of the first operating condition or the second operating condition at the secondary side at time t=0, the primary side high frequency current $I_{1,hf}$ increases and changes phase. The primary side high frequency voltage $U_{1,hf}$ is supplied from the primary side DC/AC converter 14 and is therefore unchanged.

FIG. 13(b) shows the secondary side high frequency current $I_{2,hf}$ and the secondary side high frequency voltage $U_{2,hf}$ according to the first operating condition of the inductive power transfer system illustrated in FIG. 11 or according to the second operating condition of the inductive power transfer system shown in FIG. 12.

As shown in FIG. 13(b), the secondary side high frequency voltage $U_{2,hf}$ increases according to the variations of the primary side high frequency current $I_{1,hf}$. The secondary side high frequency current $I_{2,hf}$ drops to zero.

Figure 14:
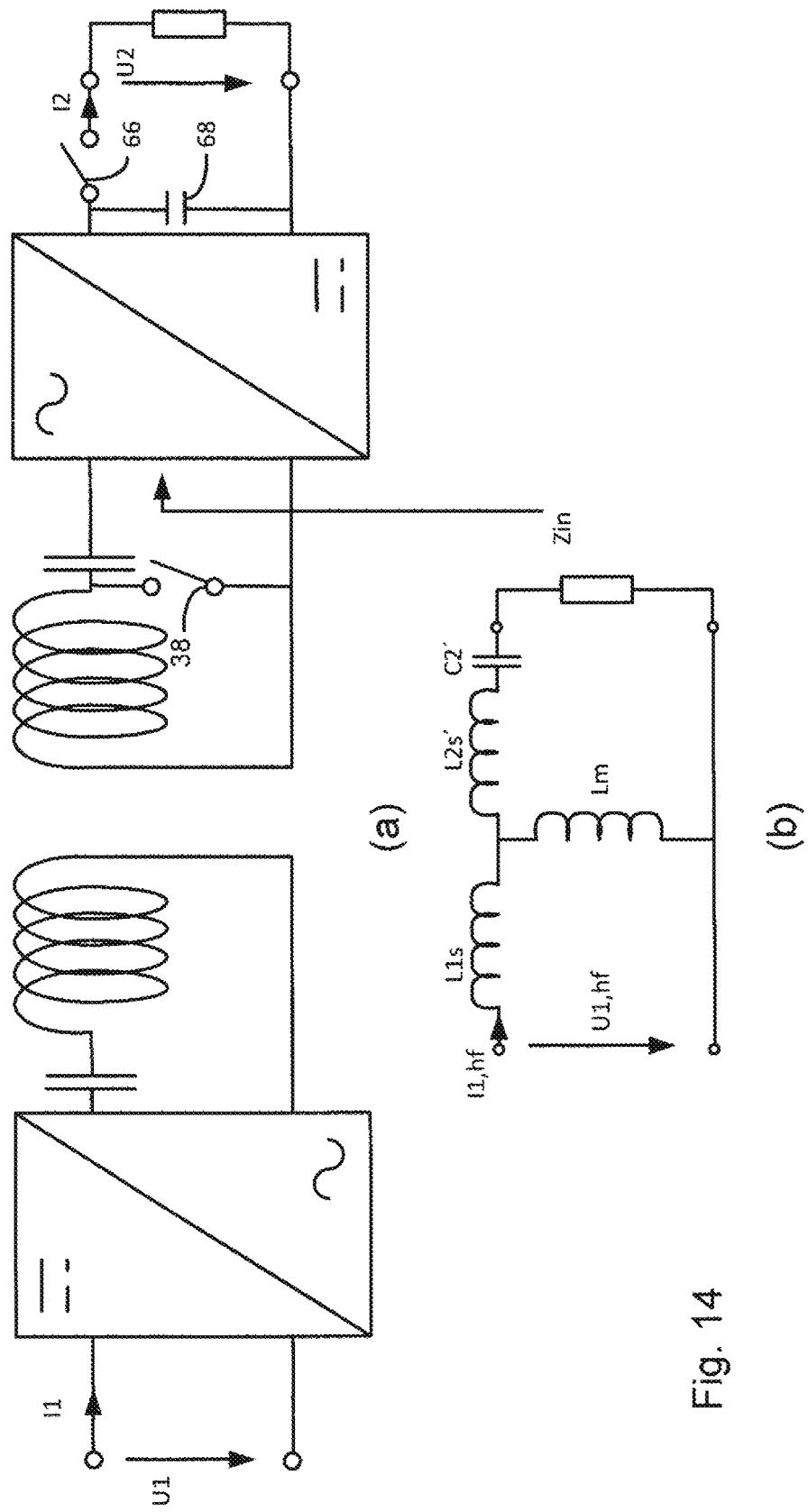
FIG. 14 shows a schematic diagram according to a third operating condition of the inductive power transfer system according to the present invention and a related equivalent circuit diagram.
Figure 15:
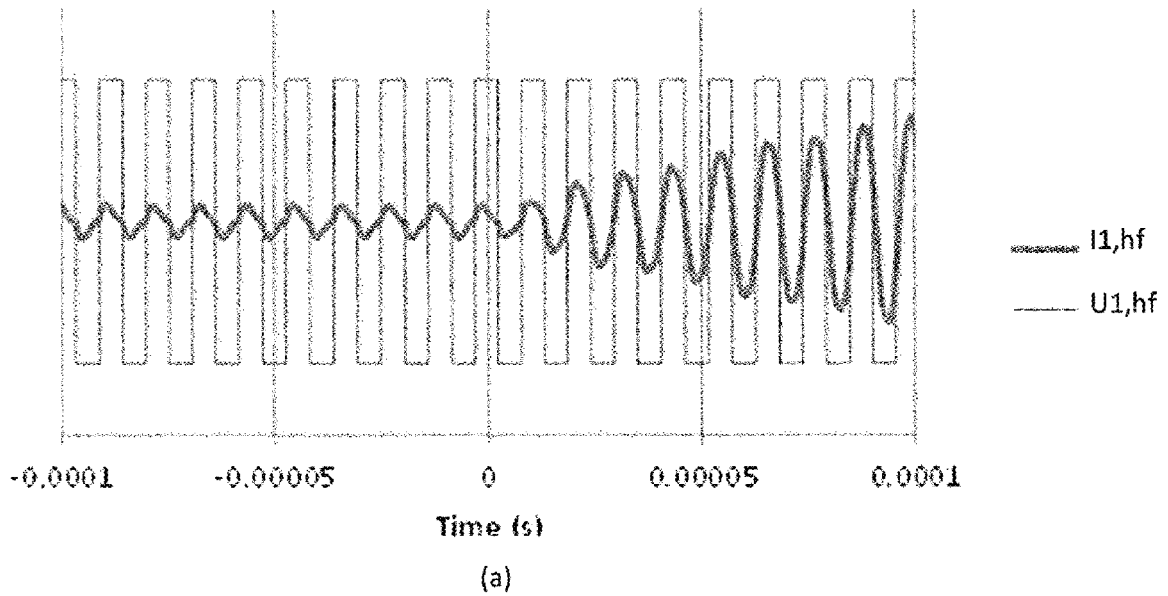
FIG. 15(a) shows a primary side high frequency current and a primary side high frequency voltage according to the third operating condition of the inductive power transfer system illustrated in FIG. 14.
FIG. 15(b) shows a secondary side high frequency current and a secondary side high frequency voltage according to the third operating condition of the inductive power transfer system illustrated in FIG. 14.
Figure 15:
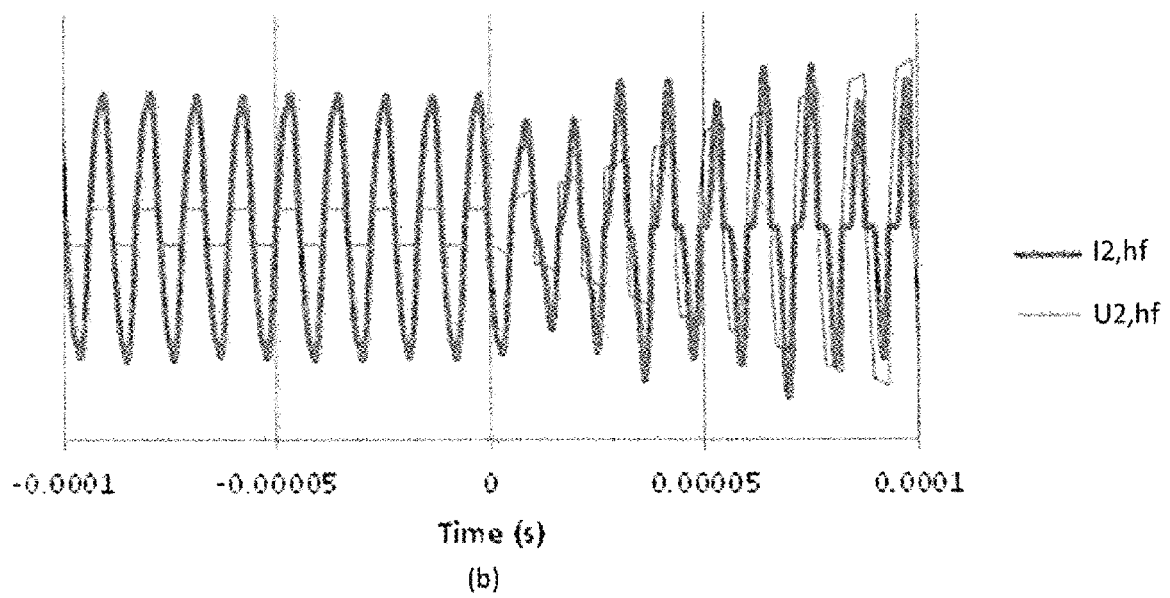

FIG. 14 shows a schematic diagram according to a third operating condition of the inductive power transfer system according to the present invention and a related equivalent circuit diagram.

As shown in FIG. 14(a), the third operating condition relates to a disconnection of the secondary side AC/DC converter 28 from the load 30.

As shown in FIG. 14(a), the third operating condition may be represented by an opening of a third model switch 66 inserted at a location of a possible disconnection of the secondary side AC/DC converter 28 from the load 30. Should the third operating condition materialize, then the short circuit protection switch 38 may still protect the receiver coil 24 from over voltages. As shown in FIG. 14(a) at the output of the secondary side AC/DC converter 28 there remains a capacitive behavior that may be modelled by a capacitor 68.

As shown in FIG. 14(b), the equivalent circuitry modelling the third operating condition is comparable to the equivalent circuit modelling the first operating condition or the second operating condition. However, as the disconnection is at the output side of the secondary side AC/DC converter 28, there remains an input resistance Zi seen from the input side of the secondary side AC/DC converter 28 which has to be added to the equivalent circuitry as shown in FIG. 14(b). Here, the value of the input resistance Zi is determined by the transfer characteristic of the secondary side AC/DC converter 28 and the capacitance of the capacitor 68.

FIG. 15(a) shows the primary side high frequency current $I_{1,hf}$ and the primary side high frequency voltage $U_{1,hf}$ according to the third operating condition of the inductive power transfer system illustrated in FIG. 14.

As shown in FIG. 15(a), at the primary side the primary side high frequency current $I_{1,hf}$ increases and changes phase. Compared to the first operating condition the increase of the primary side high frequency current $I_{1,hf}$ is reduced due to the additional parallel branch with the impedance Zi. The primary side high frequency voltage $U_{1,hf}$ is supplied from the primary side DC/AC converter 14 and therefore unchanged.

FIG. 15(b) shows the secondary side high frequency current $I_{2,hf}$ and the secondary side high frequency voltage $U_{2,hf}$ according to the third operating condition of the inductive power transfer system illustrated in FIG. 14.

As shown in FIG. 15(b), at the secondary side the amplitude of the secondary side high frequency current $I_{2,hf}$ does not change significantly while the secondary side high frequency voltage $U_{2,hf}$ increases. Here, the increase in the secondary side high frequency voltage $U_{2,hf}$ is potentially slower due to charging the dc link of the secondary side. This causes an increase of the primary side high frequency current $I_{1,hf}$ at the primary side of the inductive power transfer system.

Figure 16:
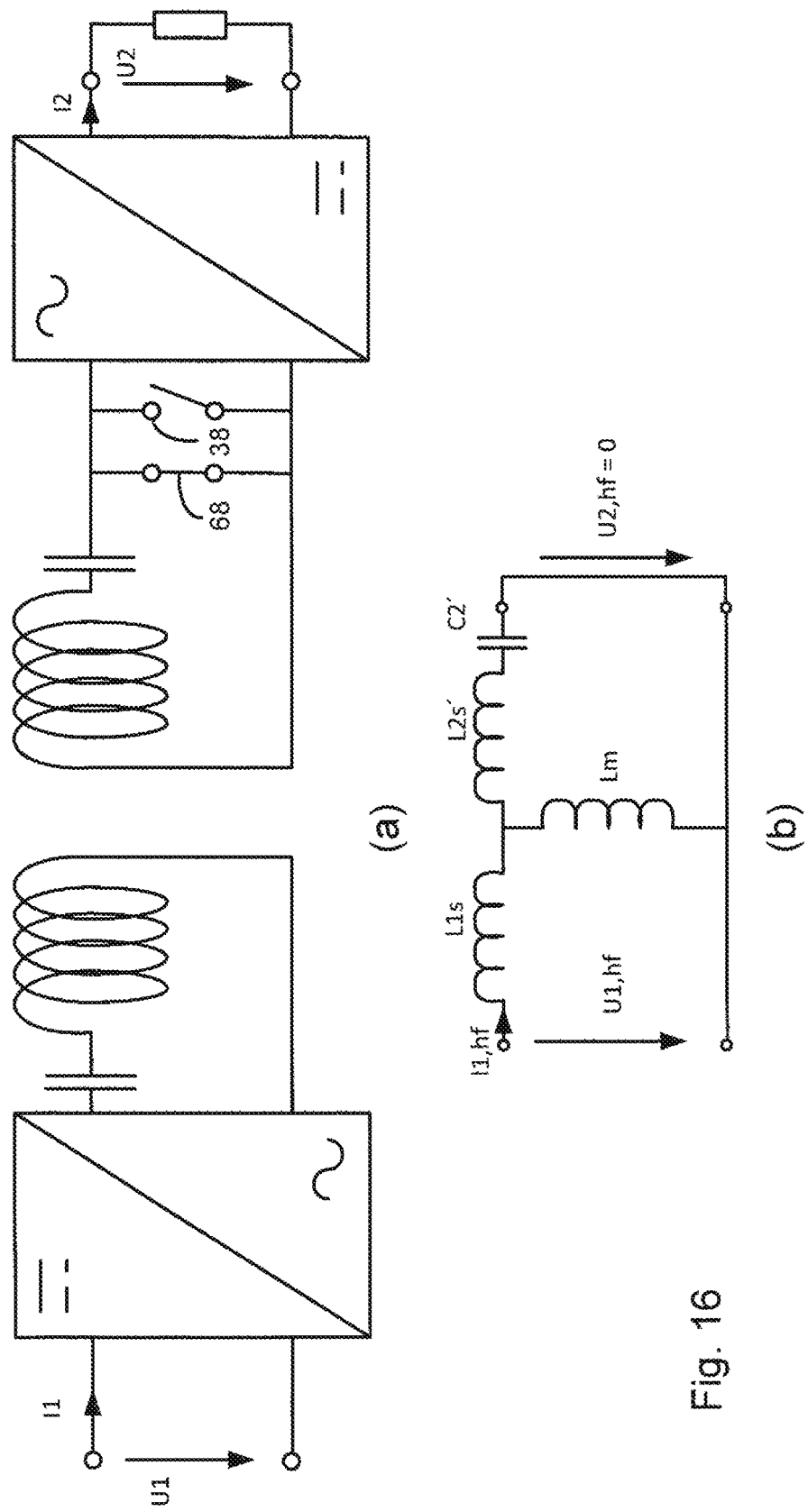
FIG. 16 shows a schematic diagram according to a fourth operating condition of the inductive power transfer system according to the present invention and a related equivalent circuit diagram.
Figure 17:
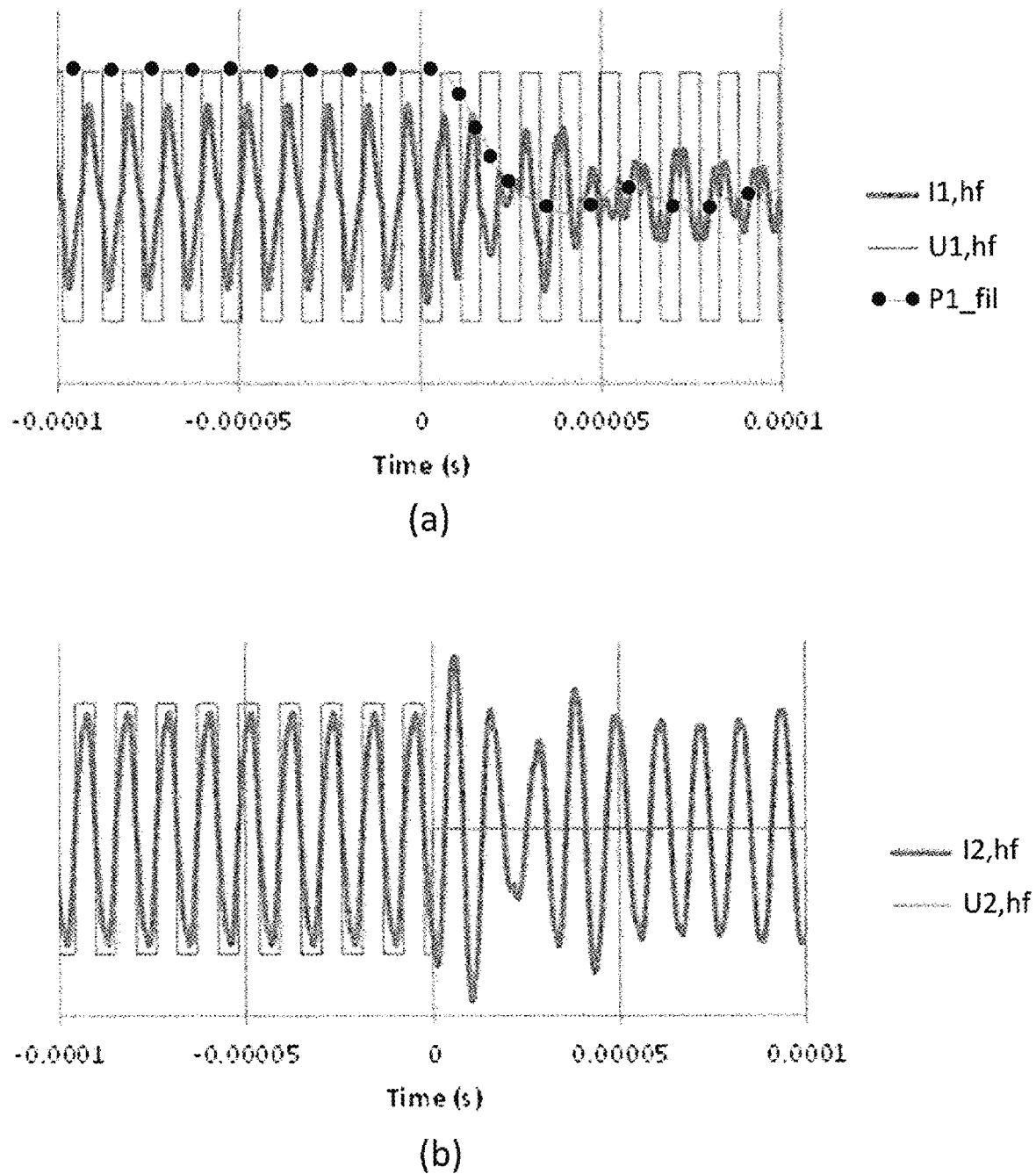
FIG. 17(a) shows a primary side high frequency current, a primary side high frequency voltage, and a primary side power according to the fourth operating condition of the inductive power transfer system illustrated in FIG. 16.
FIG. 17(b) shows a secondary side high frequency current and a secondary side high frequency voltage according to the fourth operating condition of the inductive power transfer system illustrated in FIG. 16.

FIG. 16 shows a schematic diagram according to a fourth operating condition of the inductive power transfer system according to the present invention and a related equivalent circuit diagram.

As shown in FIG. 16(a), the fourth operating condition may be represented by a closing of a fourth model switch 68 inserted at a location of a possible short circuit at the input of the secondary side AC/DC converter 28.

As shown in FIG. 16(b), the equivalent circuitry modelling the fourth operating condition comprises reactive components only. The value of the secondary side high frequency voltage $U_{2,hf}$ is zero. A phase shift between the secondary side high frequency current $I_{2,hf}$ and the primary side high frequency voltage $U_{1,hf}$ will approach a value of 90°. Further, the effective power supplied to the inductive power transfer system has a value of zero.

FIG. 17(a) shows the primary side high frequency current $I_{1,hf}$, the primary side high frequency voltage $U_{1,hf}$, and a primary side power according to the fourth operating condition of the inductive power transfer system illustrated in FIG. 16 at time t=0.

As shown in FIG. 17(a) the primary side high frequency voltage $U_{1,hf}$ is constantly supplied by the primary side DC/AC converter 14. The primary side high frequency current $I_{1,hf}$ changes phase with respect to the primary side high frequency voltage and has reduced amplitude. Thus also the power $P_{1\_fil}$ supplied at the primary side is reduced.

FIG. 17(b) shows the secondary side high frequency current $I_{2,hf}$ and the secondary side high frequency voltage $U_{2,hf}$ according to the fourth operating condition of the inductive power transfer system illustrated in FIG. 16.

As shown in FIG. 17(b), the secondary side high frequency voltage $U_{2,hf}$ is zero due to the short circuit operating condition. The secondary side high frequency current $I_{2,hf}$ oscillates due to the series resonance characteristics of the secondary branch in the equivalent circuit as shown in FIG. 16(b).

Figure 18:
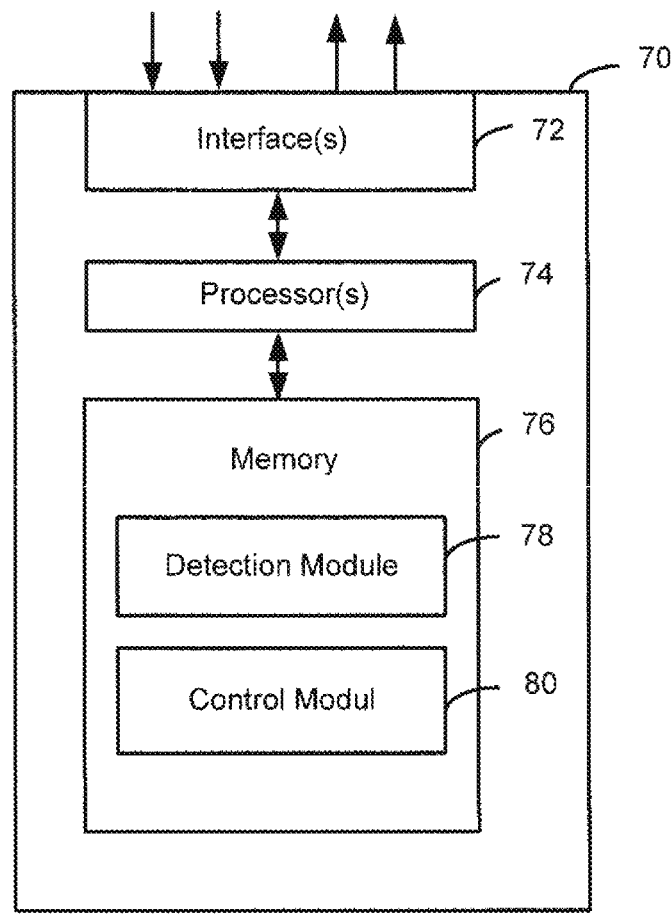
FIG. 18 shows a schematic circuit diagram of a controller for an inductive power transfer system according to a sixth exemplary embodiment of the present invention.

FIG. 18 shows a schematic circuit diagram of a controller apparatus 70 for an inductive power transfer system 10, 34 according to a sixth exemplary embodiment of the present invention.

As shown in FIG. 18, the controller apparatus 70 comprises at least one interface 72, e.g., a radio interface. The interface 72 is suitable for wireless information exchange, e.g., with a remote controller in the inductive power transfer system 10, 34, or with an external control station of the inductive power transfer system 10, 34. In some scenarios, the interface 72 may also be used for exchange of information with external systems, e.g., a maintenance system.

As shown in FIG. 18, the controller apparatus 70 comprises at least one processor 74 coupled to the interface 72 and a memory 76 coupled to the at least one processor 74. The memory 76 may include a read-only memory ROM, e.g., a flash ROM, a random access memory RAM, e.g., a dynamic RAM DRAM or a static RAM SRAM, a mass storage, e.g., a hard disc or solid state disc, or the like. The memory 76 also includes instructions, e.g., suitably configured program code to be executed by the at least one processor 74 in order to implement a later described functionality of the controller apparatus 70. This functionality will be referred to in the following as modules. It is noted that these modules do not represent individual hardware elements of the controller apparatus 70, but rather represent functionalities generated when the at least one processor 74 execute the suitably configured program code.

As shown in FIG. 18, the memory 76 may include suitably configured program code to implement a detection module 78 and a control module 80.

Figure 19:
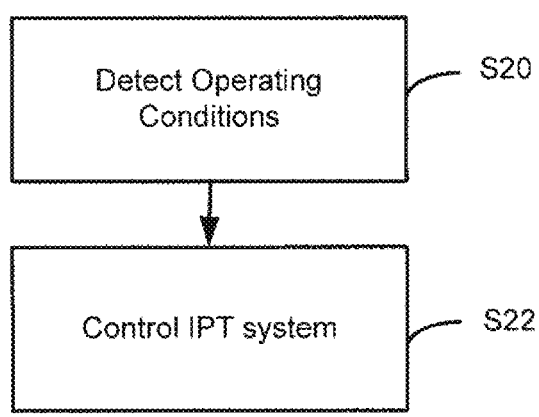
FIG. 19 shows a flowchart of operation for the controller according to the sixth exemplary embodiment of the present invention as shown in FIG. 18.

FIG. 19 shows a flowchart of operation for the controller apparatus 70 according to the sixth exemplary embodiment of the present invention as shown in FIG. 18.

As shown in FIG. 19, operatively the detection module 78, in cooperation with the processor 74, is adapted to execute a step S20 for detection of operating conditions at the primary side of the inductive power transfer system 10, 34 according to the present invention as outlined above.

As shown in FIG. 19, operatively the control module 80, in cooperation with the processor 74, is adapted to execute a step S22 for control of an operation of the inductive power transfer system in response to detected operating conditions at the primary side of the inductive power transfer system 10, 34.

Further, operatively the control module 80, in cooperation with the processor 74, may be adapted to execute a control of the inductive power transfer system 10, 34 in response to operating conditions detected at a secondary side of an inductive power transfer system 10, 34.

Figure 20:
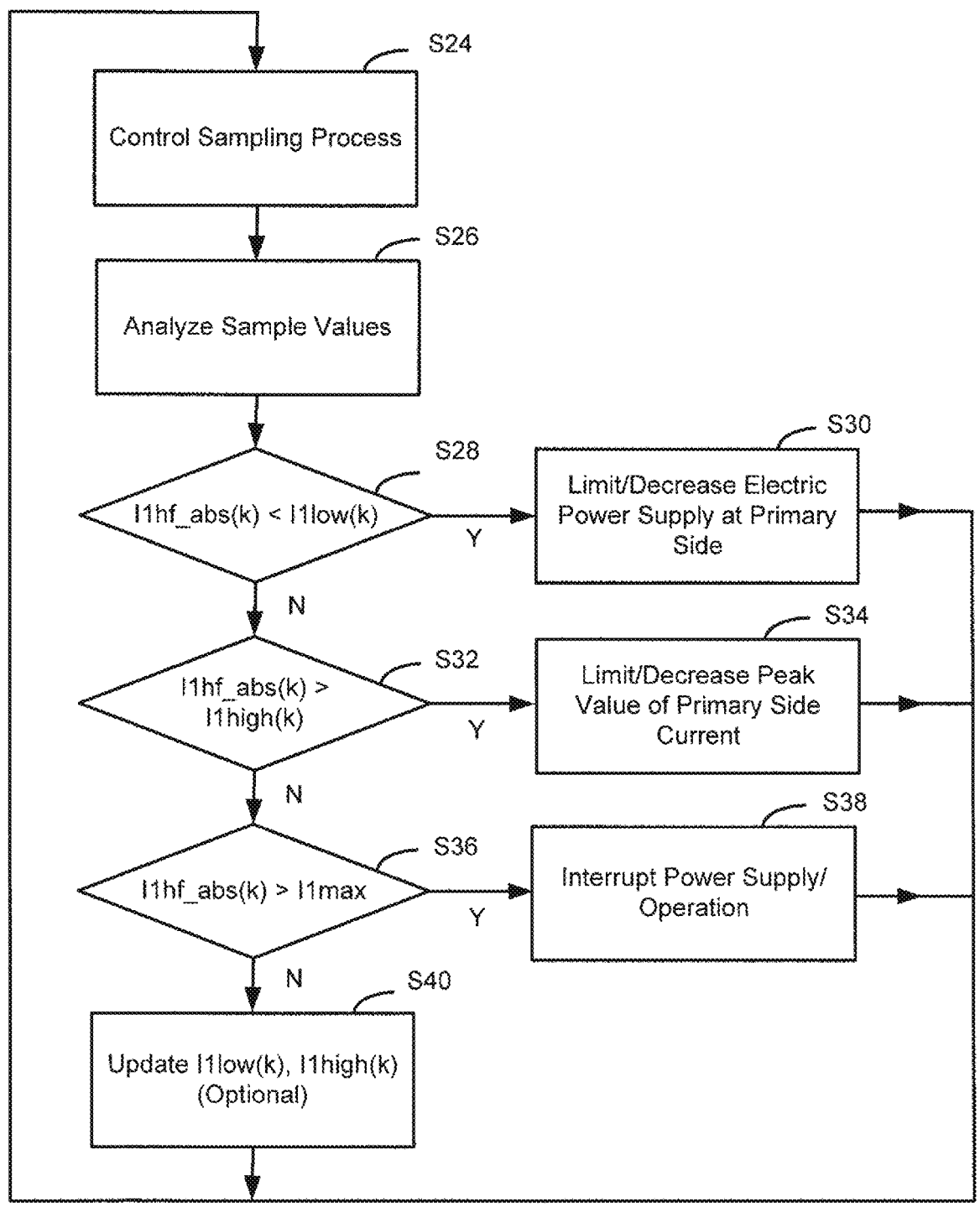
FIG. 20 shows a further detailed flowchart of operation for the controller according to the sixth exemplary embodiment of the present invention as shown in FIG. 18.

FIG. 20 shows a further detailed flowchart of operation for the controller apparatus 70 according to the sixth exemplary embodiment of the present invention as shown in FIG. 18.

According to the sixth exemplary embodiment of the present invention the inductive power transfer system 10, 34 comprises the primary side DC/AC converter 14 for converting a direct current input signal into the high frequency primary side current $I_{hf,1}$ and the high frequency primary side voltage $U_{hf,1}$ and the at least one electric variable for detecting the operating state at the secondary side is the high frequency primary side current $I_{hf,1}$.

As shown in FIG. 20, operatively the detection module 78, in cooperation with the processor 74, is adapted to execute a step S24 to control a sampling process of the primary side high frequency current $I_{hf,1}$ with a phase shift relative to the primary side high frequency voltage $U_{hf,1}$.

As shown in FIG. 20, operatively the detection module 78, in cooperation with the processor 74, is adapted to execute a step S26 to analyze absolute values $I_{1hf\_abs}(k)$ of sample values of the high frequency primary side current $I_{1,hf}$ by using a threshold scheme set up by a first lower threshold $I_{1low}(k)$, a second higher threshold $I_{1high}(k)$, and a third maximum threshold $I_{1max}$ according to $$I_{1low}(k) < I_{1hf\_abs}(k) < I_{1high}(k) < I_{1max}$$

$$I_{1low}(k) = g_m U_{2,hf}(k) - c(k)$$

$$I_{1high}(k) = g_m U_{2,hf}(k) + d(k)$$

wherein $$g_m = \frac{1}{2\pi f_0 L_{12}}$$

is the trans-conductance, $f_0$ is the resonant frequency at the primary side of the inductive power transfer system, and L12 is the mutual inductance or a representative value for the trans-conductance;

c(k) is a lower bound for observing regular operation at the secondary side of the inductive power transfer system 10, 34 in relation to $g_m U_{2,hf}(k)$; and d(k) is a upper bound for observing regular operation at the secondary side of the inductive power transfer system 10, 34 in relation to $g_m U_{2,hf}(k)$.

As shown in FIG. 20, operatively the detection module 78, in cooperation with the processor 74, is adapted to execute a step S28 to detect the short circuit condition at the secondary side of the inductive power transfer system 10, 34 when absolute values $I_{1hf\_abs}(k)$ of the sample values of the high frequency primary side current $I_{1,hf}$ are lower than the first lower threshold $I_{1low}(k)$ over a first predetermined period of time. Then, operatively the control module 80, in cooperation with the processor 74, is adapted to execute a step S30 to decrease the electric power supply at the primary side of the inductive power transfer system 10, 34 for protection of hardware circuitry in the inductive power transfer system 10, 34.

As shown in FIG. 20, operatively the detection module 78, in cooperation with the processor 74, is adapted to execute a step S32 to detect the open circuit condition at the secondary side of the inductive power transfer system 10, 34 when absolute values $I_{1hf\_abs}(k)$ of the sample values of the high frequency primary side current are higher than the second higher threshold $I_{1high}(k)$ over a second predetermined period of time. Then, operatively the control module 80, in cooperation with the processor 74, is adapted to execute a step S34 to limit the peak value of the primary side current for protection of hardware circuitry in the inductive power transfer system 10, 34. Optionally, the control module 80, in cooperation with the processor 74, may also be adapted to decrease the power supplied to the inductive power transfer system 34.

As shown in FIG. 20, operatively the control module 80, in cooperation with the processor 74, is adapted to execute a step S38 to interrupt the operation of the inductive power transfer system 10, 34 when the absolute values $I_{1hf\_abs}(k)$ of the sample values of the high frequency primary side current $I_{1,hf}$ exceed the third maximum threshold $I_{1max}$ over a third predetermined period of time for protection of hardware circuitry in the inductive power transfer system 10, 34.

As shown in FIG. 20, operatively the control module 80, in cooperation with the processor 74, is adapted to execute a step S40 to control the first lower threshold $I_{1low}(k)$ and the second higher threshold $I_{1high}(k)$ in an adaptive manner according to a time varying trans-conductance of the inductive power transfer system 10, 34.

As shown in FIG. 20 the controller apparatus 70 is adapted to iterate the steps S24 to S40 for a continuous control of the inductive power transfer system.

In conclusion, the present invention adds an extra level of safety to inductive power transfer systems and supports instantaneous detection of operating conditions at the secondary side of the inductive power transfer systems, e.g., an error state. According to the present invention such operating conditions at the secondary side may be detected in a very fast manner.

This extra level of safety may be used to reduce costs of system implementation, e.g., costs of the extra short circuit protection switch at the secondary side. Additionally the present invention avoids generation of a short circuit operating condition at the secondary side of inductive power transfer systems which can lead to very high currents and/or voltages at the moment of switching, due to EMI problems during switching and related disturbance of communication and control channels.

While above the present invention has been described with reference to the drawings and figures, it should be noted that clearly the present invention may also be implemented using variations and modifications thereof which will be apparent and can be readily made by those skilled in the art without departing from the scope and spirit of the present invention. E.g., functionalities described above may be realized in software, in hardware, or a combination thereof.

Accordingly, it is not intended that the scope of claims appended hereto is limited to the description as set forth herein, but rather that the claims should be construed so as to encompass all features of presentable novelty that preside in the present invention, including all features that would be treated as equivalent thereof by those skilled in the art to which the present invention pertains.

The invention claimed is:

1. Method of detecting an operating condition of a secondary side of an inductive power transfer system, comprising the steps:

measuring at least one electric variable at a primary side of the inductive power transfer system which is dynamically coupled to the operating condition at the secondary side of the inductive power transfer system;

executing a first analysis of the at least one electric variable over time at the primary side of the inductive power transfer system for detection of the operating condition at the secondary side of the inductive power transfer system without use of measurement data measurable at the secondary side of the inductive power transfer system;

determining a rate of change of the at least one electric variable at the primary side of the inductive power transfer system; and executing the first analysis by analyzing the rate of change of the at least one variable at the primary side of the inductive power transfer system using at least one threshold which is a fixed threshold.

2. Method according to claim 1, wherein the at least one threshold is a fixed threshold.

3. Method according to claim 2, wherein a rising edge crossing of a first threshold of a sampled electric variable at the primary side of the inductive power transfer system serves for detection of an open circuit condition at the secondary side of the inductive power transfer system.

4. Method according to claim 3, wherein the sampled electric variable at the primary side of the inductive power transfer system is a primary side high frequency current.

5. Method according to claim 2, wherein a falling edge crossing of a second threshold of a sampled electric variable at the primary side of the inductive power transfer system serves for detection of a short circuit condition at the secondary side of the inductive power transfer system.

6. Method according to claim 2, wherein the sampled electric variable at the primary side of the inductive power transfer system is a primary side high frequency current.

7. Method according to claim 1, wherein the rate of change of the at least one electric variable at the primary side of the inductive power transfer system is selected as a single value or combination of
- a rate of change of the primary side current and/or at least one value based on the rate of change of the primary side current;
- a rate of change of an electric power supplied to the primary side of the inductive power transfer system and/or at least one value based on the rate of change of the electric power supplied to the primary side of the inductive power transfer system; and
- a rate of change of the phase difference between the primary side current and the primary side voltage and/or at least one value based on the rate of change of the phase difference between the primary side current and the primary side voltage.

8. Method according to claim 1, comprising the steps:
measuring at least one electric variable at the secondary side of the inductive power transfer system for generation of measurement data in relation to the operating condition at the secondary side of the inductive power transfer system;
communicating the generated measurement data from the secondary side of the inductive power transfer system to the primary side of the inductive power transfer system;
executing a second analysis of the communicated measurement data over time at the primary side of the inductive power transfer system in combination with the first analysis for detection of the operating condition at the secondary side of the inductive power transfer system.

9. Method according to claim 1, wherein the operating condition at the secondary side of the inductive power transfer system is related to a change from a regular operating condition to a non-regular operating condition.

10. Method according to claim 9, wherein the second non-regular operating condition is an open circuit condition or a short circuit condition at the secondary side of the inductive power transfer system.

11. Method according to claim 1, wherein the step of measuring at least one electric variable over time at the primary side of the inductive power transfer system comprises:
determining sample values of the at least one electric variable and/or a value being based on the at least one electric variable; and
analyzing the at least one electric variable and/or the value being based on the at least one electric variable using the sample values and a predetermined threshold scheme;
wherein the threshold scheme comprises at least one threshold which is an adaptive threshold or a combination of a fixed threshold and an adaptive threshold.

12. Method according to claim 11, wherein the value being based on the at least one electric variable is the rate of change of the at least one electric variable.

13. Method according to claim 11, wherein the at least one electric variable is the primary side current and the step of measuring at least electric variable over time comprises:
a step of sampling the primary side current; and
a step of analyzing absolute values $I_{1hf\_abs}(k)$ of sample values of the primary side current using a threshold scheme dividing into a first lower threshold $I_{1low}(k)$ and a second higher threshold $I_{1high}(k)$ according to $$I_{1low}(k) < I_{1hf\_abs}(k) < I_{1high}(k)$$

$$I_{1low}(k) = g_m U_{2,hf}(k) - a(k)$$

$$I_{1high}(k) = g_m U_{2,hf}(k) + b(k)$$

wherein $$g_m = \frac{1}{2\pi f_0 L_{12}}$$

is the trans-conductance, $f_0$ is the resonant frequency at the primary side of the inductive power transfer system, and L12 is the mutual inductance or a representative value for the trans-conductance; and
$U_{2,hf}(k)$ is the secondary side high frequency voltage of the inductive power transfer system (10; 34);
a(k) is a lower bound for observing regular operation at the secondary side of the inductive power transfer system (10; 34) in relation to $g_m U_{2,hf}(k)$; and
b(k) is a upper bound for observing regular operation at the secondary side of the inductive power transfer system (10; 34) in relation to $g_m U_{2,hf}(k)$.

14. Method according to claim 13, comprising the steps:
detecting the short circuit condition at the secondary side of the inductive power transfer system when absolute values $I_{1hf\_abs}(k)$ of the sample values of the primary side current are lower than the first lower threshold $I_{1low}(k)$ over a first pre-determined period of time; and/or
detecting the open circuit condition at the secondary side of the inductive power transfer system when the absolute values $I_{1hf\_abs}(k)$ of the sample values of the primary side current are higher than the second higher threshold $I_{1high}(k)$ over a second predetermined period of time.

15. Method of controlling an inductive power transfer system, comprising the steps:
detecting operating conditions at a secondary side of an inductive power transfer system according to claim 1;
controlling an operation of the inductive power transfer system in response to detected operating conditions of the inductive power transfer system.

16. Method according to claim 15, wherein the primary side of the inductive power transfer system comprises an inverter for converting a direct current input signal into a high frequency primary side current and a high frequency primary side voltage and wherein the at least one electric variable for detecting the operating state at the secondary side is the high frequency primary side current, comprising the step:

sampling the high frequency primary side current with a phase shift relative to the high frequency primary side voltage.

17. Method according to claim 16, comprising the steps:

analyzing absolute values $I_{1hf\_abs}(k)$ of sample values of the high frequency primary side current by using a threshold scheme set up by a first lower threshold $I_{1low}(k)$, a second higher threshold $I_{1high}(k)$, and a third maximum threshold $I_{1max}$ according to $$I_{1low}(k) < I_{1hf\_abs}(k) < I_{1high}(k) < I_{1max}$$

$$I_{1low}(k) = g_m U_{2,hf}(k) - c(k)$$

$$I_{1high}(k) = g_m U_{2,hf}(k) + d(k)$$

wherein $$g_m = \frac{1}{2\pi f_0 L_{12}}$$

is the trans-conductance, $f_0$ is the resonant frequency at the primary side of the inductive power transfer system, and L12 is the mutual inductance or a representative value for the trans-conductance;

c(k) is a lower bound for observing regular operation at the secondary side of the inductive power transfer system in relation to $g_m U_{2,hf}(k)$; and d(k) is a upper bound for observing regular operation at the secondary side of the inductive power transfer system in relation to $g_m U_{2,hf}(k)$;

the method further comprising the step:

detecting the short circuit condition at the secondary side of the inductive power transfer system when absolute values $I_{1hf\_abs}(k)$ of the sample values of the high frequency primary side current are lower than the first lower threshold $I_{1low}(k)$ over a first predetermine period of time; and limiting or decreasing the electric power supply at the primary side of the inductive power transfer system for protection of hardware circuitry in the inductive power transfer system.

18. Method according to claim 17, further comprising the steps:

detecting the open circuit condition at the secondary side of the inductive power transfer system when absolute values $I_{1hf\_abs}(k)$ of the sample values of the high frequency primary side current are higher than the second higher threshold $I_{1high}(k)$ over a second predetermined period of time; and limiting or decreasing the electric power supply at the primary side of the inductive power transfer system peak value of the primary side current for protection of hardware circuitry in the inductive power transfer system upon detection of an open circuit condition or short circuit condition of the secondary side of the inductive power transfer system.

19. Method according to claim 17, comprising the step:

interrupting the operation of the inductive power transfer system when the absolute values $I_{1hf\_abs}(k)$ of the sample values of the high frequency primary side current exceed the third the maximum threshold $I_{1max}$ over a third predetermined period of time for protection of hardware circuitry in the inductive power transfer system.

20. Method according to claim 17, comprising the step:

controlling the first lower threshold $I_{1low}(k)$ and the second higher threshold $I_{1high}(k)$ in an adaptive manner according to a time varying trans-conductance of the inductive power transfer system.

21. Controller apparatus for controlling an inductive power transfer system, the controller comprising at least one interface to establish input output functionality, at least one processor, and a memory storing instructions to be executed by the at least one processor, whereby the controller apparatus is adapted to:

detect operating conditions in the inductive power transfer system according to claim 1;

control an operation of the inductive power transfer system in response to detected operating conditions in the inductive power transfer system.

* * * * *